US012777955B2

(12) United States Patent
Ko et al.

(10) Patent No.: US 12,777,955 B2
(45) Date of Patent: Oct. 27, 2026

(54) INTEGRATED CIRCUIT DEVICE AND METHOD OF MANUFACTURING THE SAME

(71) Applicant: Samsung Electronics Co., Ltd., Suwon-si (KR)

(72) Inventors: Haram Ko, Suwon-si (KR); Young Ha Kim, Suwon-si (KR); Hyunjae Kang, Suwon-si (KR); Jinman Kim, Suwon-si (KR); Jonggu Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 340 days.

(21) Appl. No.: 18/654,799

(22) Filed: May 3, 2024

(65) Prior Publication Data

US 2025/0054822 A1 Feb. 13, 2025

(30) Foreign Application Priority Data

Aug. 7, 2023 (KR) ........................ 10-2023-0103101

(51) Int. Cl.
*H10W 70/698* (2026.01)
*H10W 20/41* (2026.01)
(Continued)

(52) U.S. Cl.
CPC ........ *H10W 70/698* (2026.01); *H10W 20/427* (2026.01); *H10W 72/07323* (2026.01); *H10W 72/353* (2026.01); *H10W 90/734* (2026.01)

(58) Field of Classification Search
CPC ... H10W 20/435; H10W 20/20; H10W 20/42; H10W 70/093; H10W 90/734;
(Continued)

(56) References Cited

U.S. PATENT DOCUMENTS 7,291,542 B2 11/2007 Iwamatsu et al.
7,315,064 B2 1/2008 Mitani et al.
(Continued)

OTHER PUBLICATIONS

K. T. Turner, S. M. Spearing, "Modeling of direct wafer bonding: Effect of wafer bow and etch patterns," J. Appl. Phys., Dec. 15, 2002, 92.

*Primary Examiner* — Marc-Anthony Armand

(74) *Attorney, Agent, or Firm* — Muir Patent Law, PLLC

(57) ABSTRACT

An integrated circuit device includes a first semiconductor substrate having a frontside surface and a backside surface, a front-end-of-line (FEOL) structure on the frontside surface of the first semiconductor substrate, the FEOL structure including a plurality of fin-type active regions, a back-end-of-line (BEOL) structure on the FEOL structure, a second BEOL structure on the backside surface of the first semiconductor substrate, and a second semiconductor substrate spaced apart from the first semiconductor substrate in the vertical direction with the FEOL structure and the first BEOL structure therebetween, wherein a Young's modulus of a first crystal orientation extending parallel to the frontside surface of the first semiconductor substrate is different from a Young's modulus of a second crystal orientation that overlaps the first crystal orientation in the vertical direction and extends parallel to the first crystal orientation in the second semiconductor substrate.

20 Claims, 25 Drawing Sheets

(51) Int. Cl.
*H10W 72/00* (2026.01)
*H10W 72/30* (2026.01)
*H10W 90/00* (2026.01)

(58) Field of Classification Search
CPC ............. H10D 84/834; H10D 30/6757; H10D 62/121; H10D 62/405
See application file for complete search history.

(56) References Cited

U.S. PATENT DOCUMENTS

| | | | | |
|---|---|---|---|---|
| 7,670,929 | B2 | 3/2010 | Bourdelle et al. | |
| 10,249,788 | B2 | 4/2019 | Cheng et al. | |
| 10,535,680 | B2 | 1/2020 | Shen et al. | |
| 10,811,381 | B2 | 10/2020 | Lee et al. | |
| 2003/0094674 | A1 | 5/2003 | Ipposhi et al. | |
| 2004/0087109 | A1 | 5/2004 | McCann et al. | |
| 2009/0004825 | A1 | 1/2009 | Senda et al. | |
| 2009/0186464 | A1 | 7/2009 | Morimoto et al. | |
| 2022/0139863 | A1* | 5/2022 | Song | H10D 1/68 257/401 |
| 2024/0290769 | A1* | 8/2024 | Yu | H10W 20/20 |

* cited by examiner

INTEGRATED CIRCUIT DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2023-0103101, filed on Aug. 7, 2023, in the Korean Intellectual Property Office, the content of which is incorporated by reference herein in its entirety.

BACKGROUND

The inventive concept relates to an integrated circuit (IC) device and a method of manufacturing the same, and more particularly, to an IC device having a backside power delivery network (BSPDN) structure in which a wiring structure is formed at a backside of a substrate and a method of manufacturing the IC device.

Due to the development of electronics technology, the downscaling of IC devices has rapidly progressed. Accordingly, research is being conducted to efficiently design wiring structures to achieve high integration while ensuring functions and operating speed required for the IC devices. In addition, in an IC device manufactured by using a single-crystalline semiconductor substrate, as the semiconductor substrate gradually becomes thinner and sizes of patterns to be formed on the semiconductor substrate become smaller, overlap consistency of patterns formed at different vertical levels deteriorates. Accordingly, even when the semiconductor substrate gradually becomes thinner and the sizes of patterns to be formed on the semiconductor substrate become smaller, it is desirable to develop an IC device having a structure with excellent overlay consistency and a method of manufacturing the IC device.

SUMMARY

The inventive concept provides an integrated circuit (IC) device having a structure capable of minimizing bending distortion of a semiconductor substrate and overlay errors of patterns formed at different vertical levels on the semiconductor substrate even when a semiconductor substrate gradually becomes thinner and sizes of patterns to be formed on the semiconductor substrate become smaller.

The inventive concept also provides a method of manufacturing an IC device, which may improve critical dimension (CD) uniformity of patterns required to manufacture the IC device and enable the manufacture of reliable IC devices by minimizing process failures caused by bending distortion of a semiconductor substrate and overlay errors in patterns formed at different vertical levels on the semiconductor substrate even when the semiconductor substrate gradually becomes thinner and sizes of patterns to be formed on the semiconductor substrate become smaller.

According to an aspect of the inventive concept, there is provided an IC device including a first semiconductor substrate having a frontside surface and a backside surface, which are opposite to each other, a front-end-of-line (FEOL) structure on the frontside surface of the first semiconductor substrate, the FEOL structure including a plurality of fin-type active regions, a first back-end-of-line (BEOL) structure on the FEOL structure, the first BEOL structure being spaced apart from the first semiconductor substrate in a vertical direction with the FEOL structure therebetween, a second BEOL structure on the backside surface of the first semiconductor substrate, the second BEOL structure being spaced apart from the FEOL structure in the vertical direction with the first semiconductor substrate therebetween, and a second semiconductor substrate spaced apart from the first semiconductor substrate in the vertical direction with the FEOL structure and the first BEOL structure therebetween, wherein a Young's modulus of a first crystal orientation extending parallel to the frontside surface of the first semiconductor substrate is different from a Young's modulus of a second crystal orientation that overlaps the first crystal orientation in the vertical direction and extends parallel to the first crystal orientation in the second semiconductor substrate.

According to another aspect of the inventive concept, there is provided an IC device including a first semiconductor substrate having a frontside surface and a backside surface, which are opposite to each other, an FEOL structure on the frontside surface of the first semiconductor substrate, the FEOL structure constituting a logic cell, a first BEOL structure on the FEOL structure, the first BEOL structure being spaced apart from the first semiconductor substrate in a vertical direction with the FEOL structure therebetween, a second BEOL structure on the backside surface of the first semiconductor substrate, the second BEOL structure being spaced apart from the FEOL structure in the vertical direction with the first semiconductor substrate therebetween, and a second semiconductor substrate spaced apart from the first semiconductor substrate in the vertical direction with the FEOL structure and the first BEOL structure therebetween, wherein the FEOL structure includes a fin-type active region integrally connected to the first semiconductor substrate, a source/drain region on the fin-type active region, the source/drain region being spaced apart from the first semiconductor substrate in the vertical direction with the fin-type active region therebetween, a source/drain contact spaced apart from the first semiconductor substrate in the vertical direction with the fin-type active region and the source/drain region therebetween, the source/drain contact being connected to the source/drain region, a power rail wiring passing through the first semiconductor substrate in the vertical direction, and a contact structure having one end connected to a selected one of the source/drain region and the source/drain contact and another end connected to the power rail wiring, wherein the second BEOL structure includes a wiring layer on the backside surface of the first semiconductor substrate, the wiring layer being connected to the power rail wiring, and wherein a Young's modulus of a first crystal orientation extending parallel to the frontside surface of the first semiconductor substrate is different from a Young's modulus of a second crystal orientation that overlaps the first crystal orientation in the vertical direction and extends parallel to the first crystal orientation in the second semiconductor substrate.

According to another aspect of the inventive concept, there is provided an IC device including a first semiconductor substrate having a frontside surface and a backside surface, which are opposite to each other, an FEOL structure including a fin-type active region integrally connected to the first semiconductor substrate, a gate line over the fin-type active region, and at least one nanosheet surrounded by the gate line between the fin-type active region and the gate line, a first BEOL structure on the FEOL structure, the first BEOL structure being spaced apart from the first semiconductor substrate in a vertical direction with the FEOL structure therebetween and including a frontside wiring structure, a second BEOL structure on the backside surface of the first semiconductor substrate, the second BEOL structure being spaced apart from the FEOL structure in the vertical direction with the first semiconductor substrate therebetween, and the second BEOL structure including a backside wiring structure, and a second semiconductor substrate spaced apart from the first semiconductor substrate in the vertical direction with the FEOL structure and the first BEOL structure therebetween, wherein the frontside surface of the first semiconductor substrate has a (100) crystal plane, wherein a main surface of the second semiconductor substrate, which faces the first semiconductor substrate, has a (100) crystal plane or a (111) crystal plane, and wherein a Young's modulus of a first crystal orientation extending parallel to the frontside surface of the first semiconductor substrate is different from a Young's modulus of a second crystal orientation that overlaps the first crystal orientation in the vertical direction and extends parallel to the first crystal orientation in the second semiconductor substrate.

According to another aspect of the inventive concept, there is provided a method of manufacturing an IC device. The method includes preparing a first semiconductor substrate having a frontside surface having a (100) crystal plane and a backside surface that is opposite to the frontside surface. An FEOL structure is formed on the frontside surface of the first semiconductor substrate. A first BEOL structure is formed on the FEOL structure. A bonding layer is formed on the first BEOL structure. The first BEOL structure is bonded to a second semiconductor substrate by using the bonding layer such that the second semiconductor substrate faces the first semiconductor substrate in a vertical direction. The second semiconductor substrate has a Young's modulus that is different from a Young's modulus of the first semiconductor substrate. The first semiconductor substrate is polished from the backside surface of the first semiconductor substrate to reduce a thickness of the first semiconductor substrate while the first BEOL structure is being bonded to the second semiconductor substrate. A second BEOL structure is formed on the polished backside surface of the first semiconductor substrate while the first BEOL structure is being bonded to the second semiconductor substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
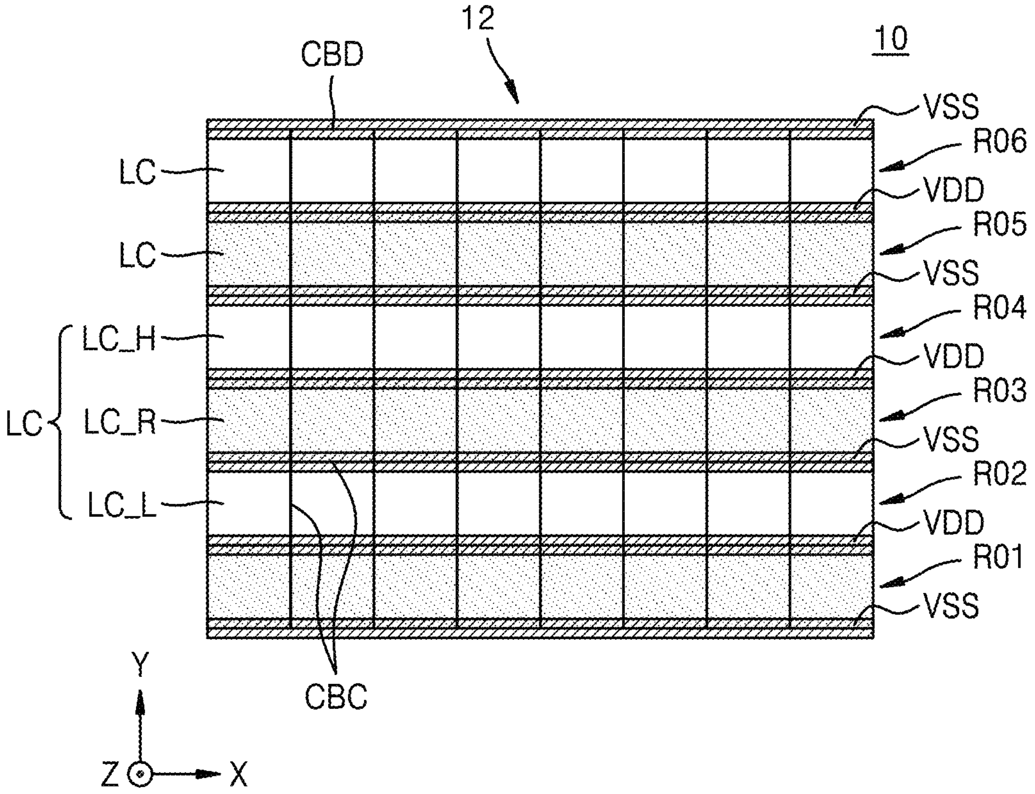
FIG. 1 is a plan view of a cell block of an integrated circuit (IC) device according to example embodiments.

Hereinafter, example embodiments will be described in detail with reference to the accompanying drawings. The same reference numerals are used to denote the same elements in the drawings, and repeated descriptions thereof are omitted.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Spatially relative terms, such as "beneath," "below," "lower," "above," "upper" and the like, may be used herein for case of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, the terms "integrally connected" may refer to structures, patterns, and/or layers that are formed at the same time and of the same material, without a break in the continuity of the material of which they are formed. As one example, structures, patterns, and/or layers that are "integrally connected" may be homogeneous monolithic structures.

FIG. 1 is a plan view of a cell block 12 of an integrated circuit (IC) device 10 according to example embodiments.

Referring to FIG. 1, the cell block 12 of the IC device 10 may include a plurality of cells LC, which include circuit patterns configured to constitute various circuits. The plurality of cells LC may be arranged in a matrix form in a widthwise or first lateral direction (X direction of FIG. 1) and a height or second lateral direction (Y direction of FIG. 1) in the cell block 12. For example, a plurality of cells LC may be arranged in the first lateral direction (X direction) and a plurality of cells LC may be arranged in the second lateral direction (Y direction). Herein, the first lateral direction (X direction) and the second lateral direction (Y direction) may be perpendicular to one another and may be parallel to a top surface of a semiconductor substrate (e.g., a first semiconductor substrate 102 or a second semiconductor substrate 104 of FIG. 2).

Each of the plurality of cells LC may constitute a logic cell. Each of the plurality of cells LC may include a circuit pattern having a layout designed according to a place-and-route (PnR) technique to perform at least one logic function. The plurality of cells LC may perform various logic functions. In embodiments, the plurality of cells LC may respectively include a plurality of standard cells. In embodiments, at least some of the plurality of cells LC may perform the same logic function. In other embodiments, at least some of the plurality of cells LC may perform different logic functions.

The plurality of cells LC may include various kinds of cells including a plurality of circuit elements. For example, each of the plurality of cells LC may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, a latch, or a combination thereof, without being limited thereto.

In the cell block 12, at least some of the plurality of cells LC that form one row R01, R02, R03, R04, R05, or R06 in the first lateral direction (X direction of FIG. 1) may have the same width as each other. Also, at least some of the plurality of cells LC that form one row R01, R02, R03, R04, R05, or R06 may have the same height as each other. However, the inventive concept is not limited to the illustration in FIG. 1, and at least some of the plurality of cells LC that form one row R01, R02, R03, R04, R05, or R06 may have different widths and heights from each other.

An area of each of the plurality of cells LC included in the cell block 12 of the IC device 10 may be defined by a cell boundary CBD. A cell boundary contact portion CBC where respective cell boundaries CBD of two cells LC that are adjacent to each other in the first lateral direction (X direction of FIG. 1) or the second lateral direction (Y direction of FIG. 1), from among the plurality of cells LC, meet each other may be between the two adjacent cells LC.

In embodiments, from among the plurality of cells LC that form one row R01, R02, R03, R04, R05, or R06, two cells LC that are adjacent to each other in the first lateral direction (X direction) may contact each other at the cell boundary contact portion CBC without a distance therebetween. In other embodiments, from among the plurality of cells LC that form one row R01, R02, R03, R04, R05, or R06, two cells LC that are adjacent to each other in the first lateral direction (X direction) may be a predetermined distance apart from each other.

In embodiments, from among the plurality of cells LC that form one row R01, R02, R03, R04, R05, or R06, two adjacent cells LC may perform the same function as each other. In this case, the two adjacent cells LC may have the same structure as each other. In other embodiments, from among the plurality of cells LC that form one row R01, R02, R03, R04, R05, or R06, two adjacent cells may perform different functions from each other.

In embodiments, one cell LC, which is selected from the plurality of cells LC included in the cell block 12 of the IC device 10, may have a symmetrical structure to another cell LC, which is adjacent to the selected cell LC in the second lateral direction (Y direction of FIG. 1), about the cell boundary contact portion CBC therebetween. For example, a reference logic cell LC_R in the third row R03 may have a symmetrical structure with a lower logic cell LC_L in the second row R02 about the cell boundary contact portion CBC therebetween. Also, the reference logic cell LC_R in the third row R03 may have a symmetrical structure with an upper logic cell LC_H in the fourth row R04 about the cell boundary contact portion CBC therebetween.

Although FIG. 1 illustrates an example in which the cell block 12 includes six rows R01, R02, R03, R04, R05, and R06, the inventive concept is not limited thereto. The cell block 12 may include various other numbers of rows, which are selected as needed, and one row may include various numbers of logic cells, which are selected as needed.

A selected one of a plurality of ground lines VSS and a plurality of power lines VDD may be between a plurality of rows (e.g., R01, R02, R03, R04, R05, and R06), each of which includes a plurality of logic cells LC arranged in a line in the first lateral direction (X direction of FIG. 1). The plurality of ground lines VSS and the plurality of power lines VDD may each extend in the first lateral direction (X direction of FIG. 1) and may be alternately arranged apart from each other in the second lateral direction (Y direction of FIG. 1). Accordingly, the plurality of ground lines VSS and the plurality of power lines VDD may each overlap the cell boundary CBD of the cell LC in the second lateral direction (Y direction).

Figure 2:
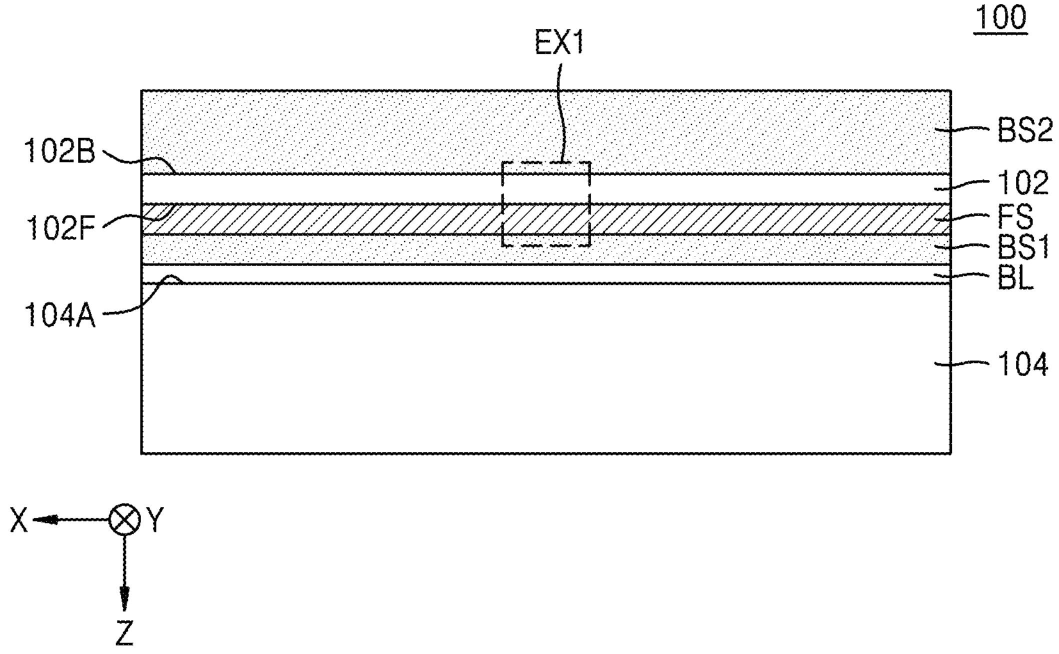
FIG. 2 is a cross-sectional view of an IC device according to example embodiments.

FIG. 2 is a cross-sectional view of an IC device 100 according to example embodiments. Components of the IC device 100 described with reference to FIG. 2 may constitute some of the plurality of cells LC shown in FIG. 1.

Referring to FIG. 2, the IC device 100 may include a first semiconductor substrate 102 and a second semiconductor substrate 104, which overlap each other in a vertical direction (Z direction). The first semiconductor substrate 102 may have a frontside surface 102F and a backside surface 102B, which are opposite to each other. The second semiconductor substrate 104 may have a main surface 104A facing the frontside surface 102F of the first semiconductor substrate 102. Each of the first semiconductor substrate 102 and the second semiconductor substrate 104 may be formed of or include a semiconductor substrate, for example, a silicon substrate. The vertical direction (Z direction) may be perpendicular to the frontside surface 102F of the first semiconductor substrate 102.

A front-end-of-line (FEOL) structure FS may be on the frontside surface 102F of the first semiconductor substrate 102. The FEOL structure FS may include a plurality of fin-type active regions (e.g., fin-type active regions F1 shown in FIGS. 8A to 8D), which are integrally connected to the first semiconductor substrate 102. The FEOL structure FS may include components required to constitute a logic cell. For example, the FEOL structure FS may include a plurality of active regions, a plurality of source/drain regions, a plurality of gate lines, and a plurality of wiring structures configured to selectively connect the plurality of active regions, the plurality of source/drain regions, and the plurality of gate lines to each other or to the outside.

A first back-end-of-line (BEOL) structure BS1 may be on the FEOL structure FS. The first BEOL structure BS1 may be spaced apart from the first semiconductor substrate 102 in the vertical direction (Z direction) with the FEOL structure FS therebetween.

A second BEOL structure BS2 may be on a backside surface 102B of the first semiconductor substrate 102. The second BEOL structure BS2 may be spaced apart from the FEOL structure FS in the vertical direction (Z direction) with the first semiconductor substrate 102 therebetween.

The second semiconductor substrate 104 may be spaced apart from the first semiconductor substrate 102 in the vertical direction (Z direction) with the FEOL structure FS and the first BEOL structure BS1 therebetween. In the first semiconductor substrate 102, a Young's modulus of a first crystal orientation extending parallel to the frontside surface 102F may be different from a Young's modulus of a second crystal orientation that overlaps the first crystal orientation in the vertical direction (Z direction) and extends parallel to the first crystal orientation in the second semiconductor substrate 104.

Figure 3A:
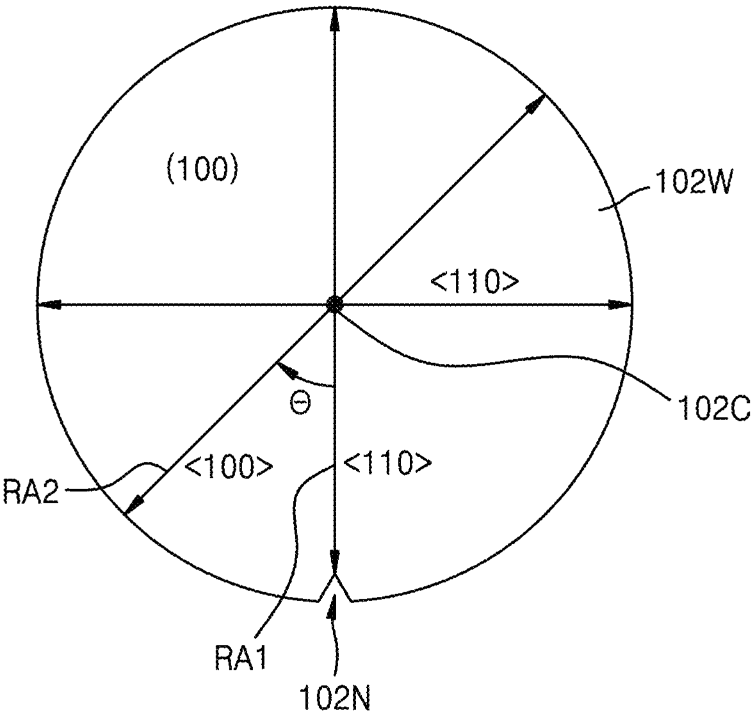
FIG. 3A is a plan view of an example of a first wafer that may be used to form a first semiconductor substrate shown in FIG. 2.
Figure 3B:
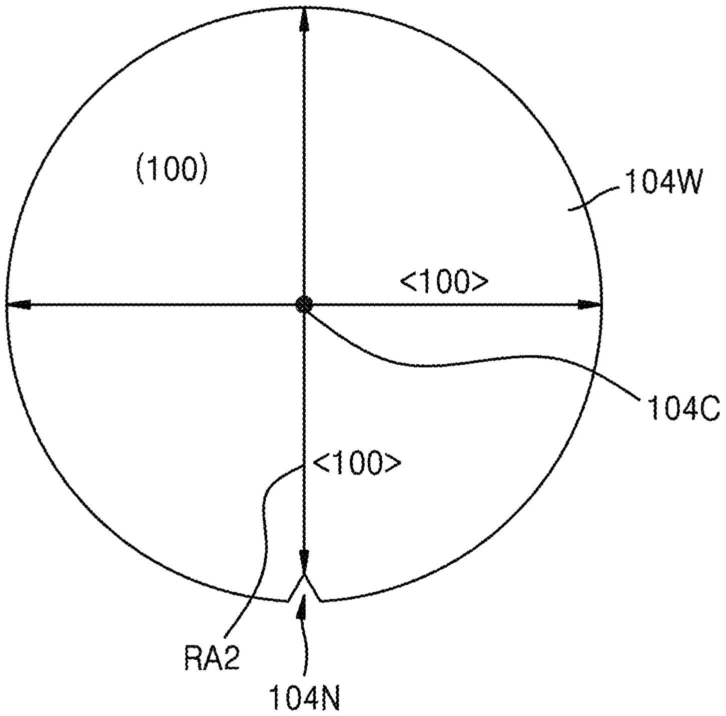
FIG. 3B is a plan view of an example of a second wafer that may be used to form a second semiconductor substrate shown in FIG. 2.

FIG. 3A is a plan view of a first wafer 102W that may be used to form the first semiconductor substrate 102 shown in FIG. 2. FIG. 3B is a plan view of a second wafer 104W that may be used to form the second semiconductor substrate 104 shown in FIG. 2.

In embodiments, the first semiconductor substrate 102 shown in FIG. 2 may be at least a portion of the first wafer 102W shown in FIG. 3A, and the second semiconductor substrate 104 shown in FIG. 2 may be at least a portion of the second wafer 104W shown in FIG. 3B. As used herein, the first wafer 102W may be referred to as the first semiconductor substrate 102, and the second wafer 104W may be referred to as the second semiconductor substrate 104. As used herein, characteristics of the first wafer 102W described below may be equally applied to the first semiconductor substrate 102. As used herein, characteristics of the second wafer 104W described below may be equally applied to the second semiconductor substrate 104.

Referring to FIGS. 2, 3A, and 3B, each of the first wafer 102W and the second wafer 104W may have a (100) crystal plane. That is, a frontside surface 102F of the first semiconductor substrate 102 shown in FIG. 2 and a main surface 104A of the second semiconductor substrate 104, which faces the first semiconductor substrate 102, may each have a (100) crystal plane.

The first wafer 102W may include a first notch 102N, which is formed in a <110> direction in an edge of the first wafer 102W in a first radial direction RA1 from a center 102C of the first wafer 102W. The second wafer 104W may include a second notch 104N, which is formed in a <100> direction in an edge of the second wafer 104W in a second radial direction RA2 from a center 104C of the second wafer 104W. The second radial direction RA2 may correspond to a direction rotated at an angle θ (e.g., 45°) selected within a range of about 40° to about 50° from the first radial direction RA1.

In embodiments, the first semiconductor substrate 102 shown in FIG. 2 may be obtained from the first wafer 102W, and the second semiconductor substrate 104 shown in FIG. 2 may be obtained from the second wafer 104W. That is, in the IC device 100 shown in FIG. 2, an alignment structure of the first semiconductor substrate 102 and the second semiconductor substrate 104 may be obtained by aligning the first wafer 102W with the second wafer 104W by rotating the second wafer 104W at an angle (e.g., 45°) selected within a range of about 40° to about 50° with respect to the first wafer 102W such that the center 102C of the first wafer 102W and the center 104C of the second wafer 104W are in one vertical line in a vertical direction (Z direction of FIG. 2), the first notch 102N of the first wafer 102W and the second notch 104N of the second wafer 104W overlap each other in the vertical direction (Z direction of FIG. 2), and the first radial direction RA1 and the second radial direction RA1 are in the same direction. In the alignment structure, the <110> direction of the first wafer 102W and the <100> direction of the second wafer 104W may be overlap each other in the vertical direction (Z direction) and extend parallel to each other. Accordingly, in the IC device 100 shown in FIG. 2, the first semiconductor substrate 102 may be aligned with the second semiconductor substrate 104 such that the <110> direction extending from and parallel to the frontside surface 102F of the first semiconductor substrate 102 and the <100> direction extending from and parallel to the main surface 104A of the second semiconductor substrate 104 overlap each other in the vertical direction (Z direction) and extend parallel to each other.

Figure 4A:
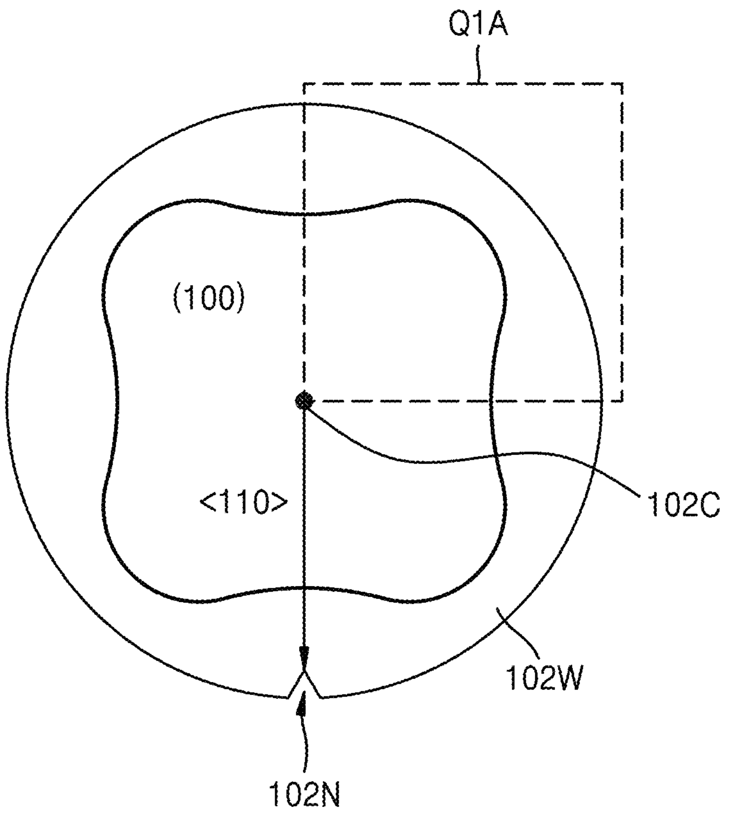
FIG. 4A is a diagram of Young's modulus according to a crystal orientation of the first wafer shown in FIG. 3A.
Figure 4B:
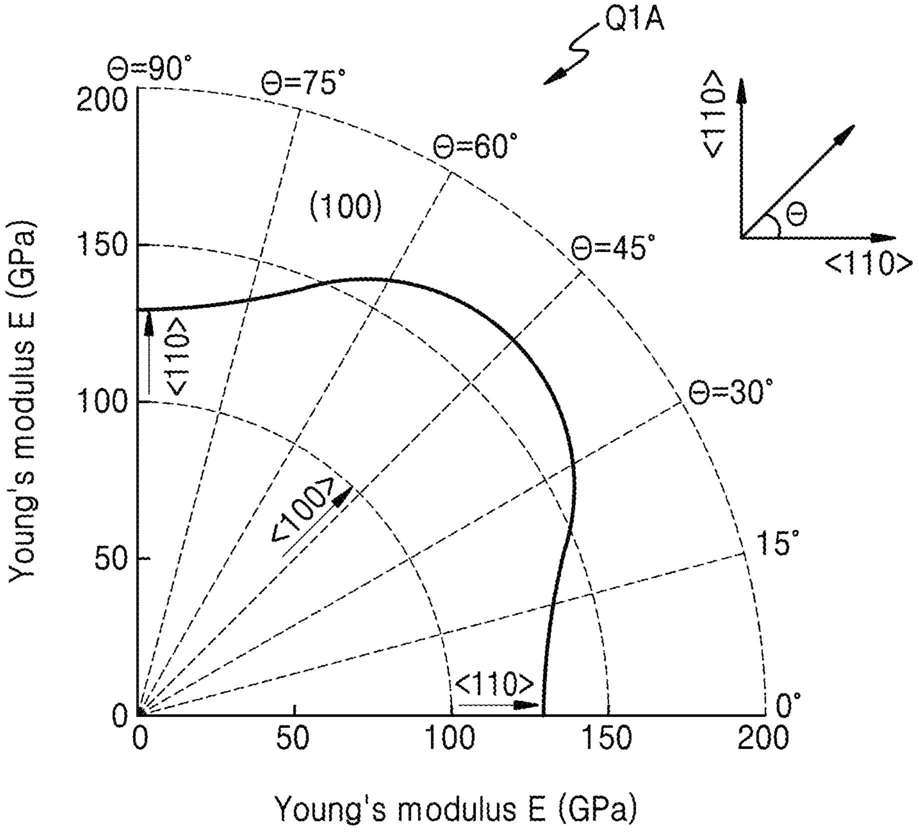
FIG. 4B is an enlarged diagram of a Young's modulus according to a crystal orientation in a local region of the first wafer shown in FIG. 4A.
Figure 5A:
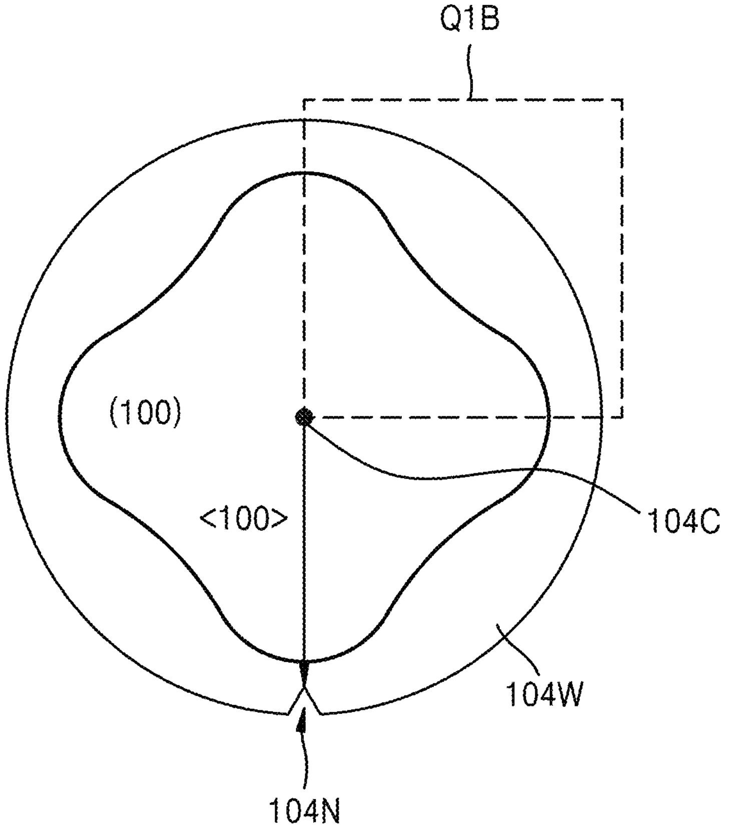
FIG. 5A is a diagram of a Young's modulus according to a crystal orientation of the second wafer shown in FIG. 3B.
Figure 5B:
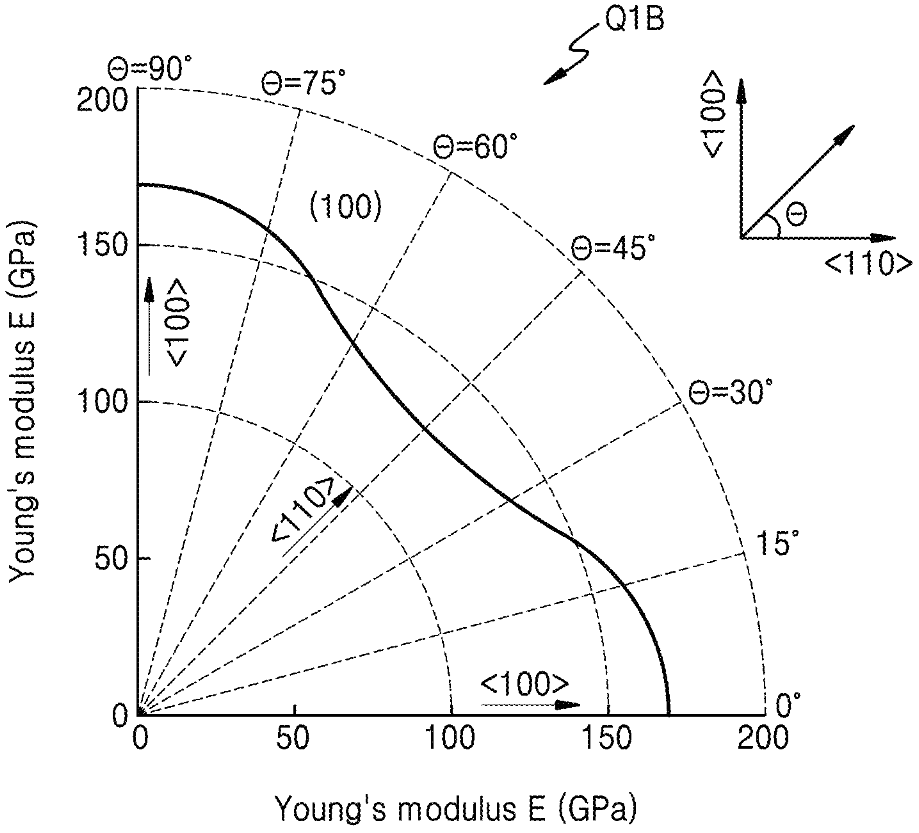
FIG. 5B is an enlarged diagram of a Young's modulus according to a crystal orientation in a local region of the second wafer shown in FIG. 5A.

FIGS. 4A and 4B are diagrams of a Young's modulus according to a crystal orientation of the first wafer 102W shown in FIG. 3A. FIG. 4B is an enlarged diagram of a Young's modulus according to a crystal orientation in a local region Q1A of the first wafer 102W shown in FIG. 4A. FIGS. 5A and 5B are diagrams of a Young's modulus according to a crystal orientation of the second wafer 104W shown in FIG. 3B. FIG. 5B is an enlarged diagram of a Young's modulus according to a crystal orientation in a local region Q1B of the second wafer 104W shown in FIG. 5A.

Referring to FIGS. 4A, 4B, 5A, and 5B, the Young's modulus of each of the first wafer 102W and the second wafer 104W may vary depending on a crystal orientation thereof. As used herein, the term "Young's modulus" refers to a degree to which a material resists external pressure. In FIGS. 4A, 4B, 5A, and 5B, (100) represents a Miller index indicating a crystal plane.

As shown in FIGS. 4A, 4B, 5A, and 5B, each of the first wafer 102W and the second wafer 104W having a (100) crystal plane may have a relatively great Young's modulus in a <100> crystal orientation and have a relatively small Young's modulus in a <110> crystal orientation. In the second wafer 104W, <100> and <110> each represent a Miller index indicating a crystal orientation.

As described above, in the IC device 100 shown in FIG. 2, an alignment structure of a first semiconductor substrate 102 and a second semiconductor substrate 104 may be obtained by aligning the first wafer 102W with the second wafer 104W by rotating the second wafer 104W at an angle (e.g., 45°) selected within a range of about 40° to about 50° with respect to the first wafer 102W while a center 102C of the first wafer 102W and a center 104C of the second wafer 104W are in one vertical line in the vertical direction (Z direction of FIG. 2). Accordingly, a Young's modulus of an arbitrary crystal orientation extending parallel to a frontside surface 102F of the first semiconductor substrate 102 (e.g., a crystal orientation in a first radial direction RA1) may be different from a Young's modulus of a crystal orientation that overlaps the arbitrary crystal orientation in the vertical direction (Z direction) and extends parallel to the arbitrary crystal orientation (e.g., a crystal orientation in the second radial direction RA2) in the second semiconductor substrate 104.

Generally, during a process of manufacturing an IC device, the biggest factors in overlap deterioration may include stress on a wafer and the resulting distortion in the wafer. In particular, in the process manufacturing an IC device including a process of bonding two wafers to each other, stress caused during the bonding process may have a direction due to differences in mechanical properties depending on a crystal structure of the wafer, resulting in distortion in the wafer. The distortion in the wafer may cause overlap deterioration in a photolithography process performed after the bonding process. Therefore, it is desirable to minimize the distortion in the wafer and suppress overlap deterioration in the process of manufacturing an IC device.

In the IC device 100 according to the inventive concept, an alignment structure of the first semiconductor substrate 102 and the second semiconductor substrate 104 that overlap each other in the vertical direction (Z direction) may be obtained by aligning the first wafer 102W with the second wafer 104W by rotating the second wafer 104W at an angle (e.g., 45°) selected within a range of about 40° to about 50° with respect to the first wafer 102W while a center 102C of the first wafer 102W and a center 104C of the second wafer 104W are in one vertical line in the vertical direction (Z direction of FIG. 2). Accordingly, a Young's modulus of an arbitrary crystal orientation extending parallel to the frontside surface 102F of the first semiconductor substrate 102 (e.g., a crystal orientation in the first radial direction RA1) may be different from a Young's modulus of a crystal orientation that overlaps the arbitrary crystal orientation in the vertical direction (Z direction) and extends parallel to the arbitrary crystal orientation (e.g., a crystal orientation in the second radial direction RA2) in the second semiconductor substrate 104. Non-uniform mechanical deformation (e.g., distortion) and overlay deterioration may be minimized during the process of manufacturing the IC device 100.

Figure 6A:
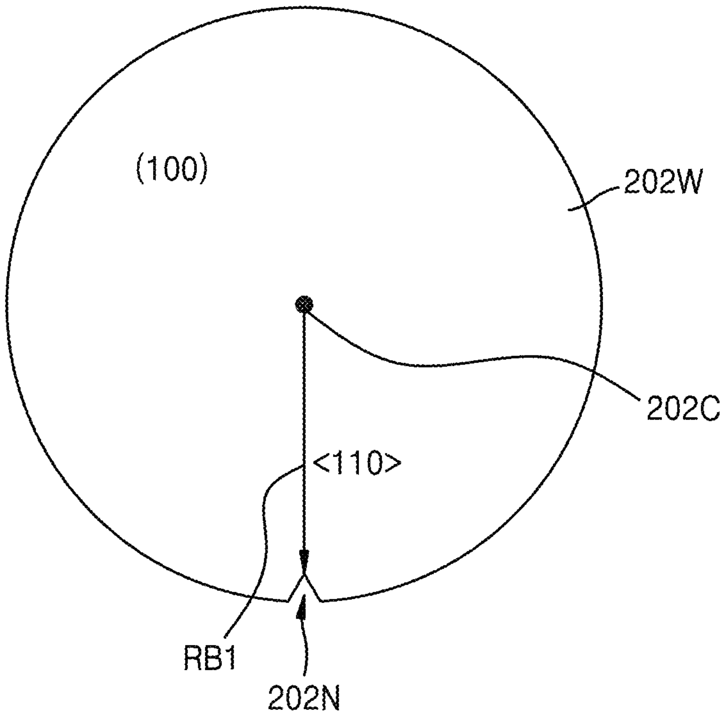
FIG. 6A is a plan view of another example of the first wafer that may be used to form the first semiconductor substrate shown in FIG. 2.
Figure 6B:
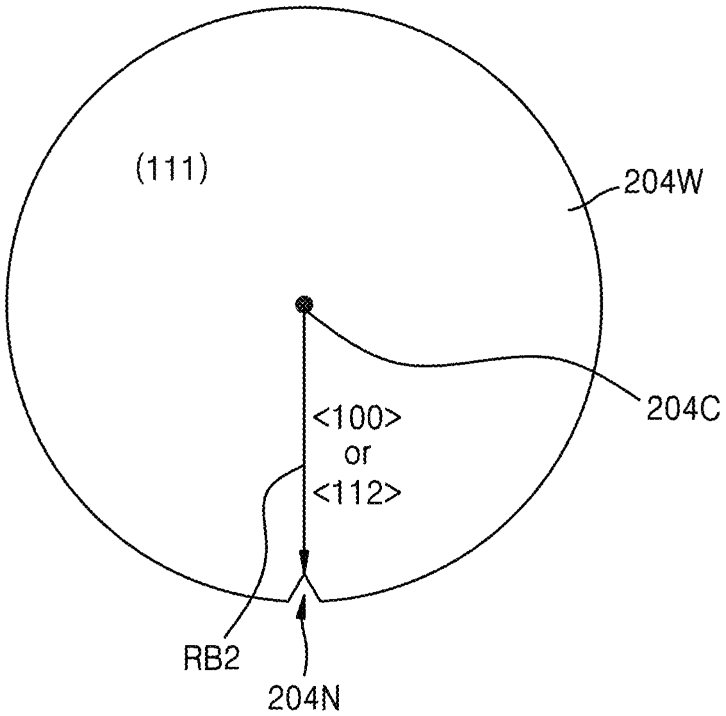
FIG. 6B is a plan view of another example of the second wafer that may be used to form the second semiconductor substrate shown in FIG. 2.

FIG. 6A is a plan view of a first wafer 202W that may be used to form the first semiconductor substrate 102 shown in FIG. 2. FIG. 6B is a plan view of a second wafer 204W that may be used to form the second semiconductor substrate 104 shown in FIG. 2.

In embodiments, the first semiconductor substrate 102 shown in FIG. 2 may be at least a portion of the first wafer 102W shown in FIG. 6A and the second semiconductor substrate 104 shown in FIG. 2 may be at least a portion of the second wafer 204W shown in FIG. 6B. As used herein, the first wafer 202W may be referred to as the first semiconductor substrate 102, and the second wafer 204W may be referred to as the second semiconductor substrate 104. As used herein, characteristics of the first wafer 202W described below may be equally applied to the first semiconductor substrate 102. As used herein, characteristics of the second wafer 204W described below may be equally applied to the second semiconductor substrate 104.

Referring to FIGS. 2, 6A, and 6B, the first wafer 202W may have a (100) crystal plane, and the second wafer 204W may have a (111) crystal plane. That is, the frontside surface 102F of the first semiconductor substrate 102 shown in FIG. 2 may each have a (100) crystal plane, and a main surface 104A of the second semiconductor substrate 104, which faces the first semiconductor substrate 102, may have a (111) crystal plane.

Details of the first wafer 202W are substantially the same as those of the first wafer 102W described with reference to FIG. 3. That is, the first wafer 202W may include a first notch 202N formed in a <110> direction in an edge of the first wafer 202W in a first radial direction RB1 from a center 202C of the first wafer 202W.

The second wafer 204W may include a second notch 204N formed in a <100> direction or a <112> direction in a second radial direction RB2 from a center 204C of the second wafer 204W.

In embodiments, the first semiconductor substrate 102 shown in FIG. 2 may be obtained from the first wafer 202W, and the second semiconductor substrate 104 shown in FIG. 2 may be obtained from the second wafer 204W. That is, in the IC device 100 shown in FIG. 2, an alignment structure of the first semiconductor substrate 102 and the second semiconductor substrate 104 may be obtained when the center 202C of the first wafer 202W and the center 204C of the second wafer 204W are in one vertical line in the vertical direction (Z direction of FIG. 2), the first notch 202N of the first wafer 202W and the second notch 204N of the second wafer 204W overlap each other in the vertical direction (Z direction of FIG. 2), and the first wafer 202W is aligned with the second wafer 204W such that the first radial direction RB1 and the second radial direction RB2 are in the same direction. In the alignment structure, the <110> direction of the first wafer 202W and the <100> direction or the <112> direction of the second wafer 204W may be overlap each other in the vertical direction (Z direction) and extend parallel to each other. Accordingly, in the IC device 100 shown in FIG. 2, the first semiconductor substrate 102 may be aligned with the second semiconductor substrate 104 such that the <110> direction extending from and parallel to the frontside surface 102F of the first semiconductor substrate 102 and the <100> direction or the <112> direction extending from and parallel to the main surface 104A of the second semiconductor substrate 104 overlap each other in the vertical direction (Z direction) and extend parallel to each other.

Like the first wafer 102W described with reference to FIGS. 4A and 4B, the first wafer 202W may have a relatively great Young's modulus in the <100> crystal orientation and have a relatively small Young's modulus in the <110> crystal orientation.

Figure 7:
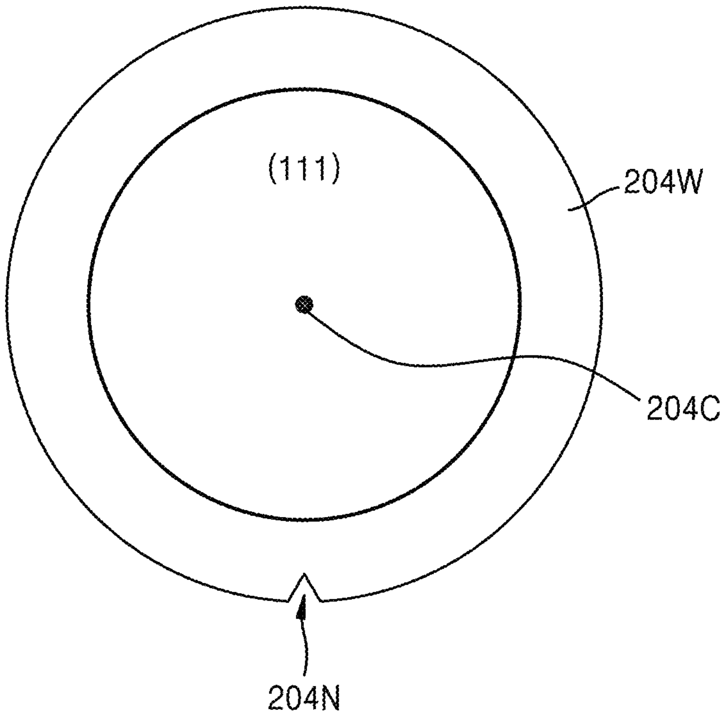
FIG. 7 is a diagram of Young's modulus according to a crystal orientation of the second wafer shown in FIG. 6B.

FIG. 7 is a diagram of Young's modulus according to a crystal orientation of the second wafer 204W shown in FIG. 6B.

Referring to FIG. 7, the second wafer 204W may have a generally constant Young's modulus according to a crystal orientation. Thus, unlike the first wafer 202W, Young's modulus, which is a unique material property of the second wafer 204W, may have physical isotropy, which does not vary according to a direction in the second wafer 204W. Accordingly, when external force is applied to the second wafer 204W, the second wafer 204W may be deformed to a uniform degree regardless of a direction in which the force is applied.

In the IC device 100 shown in FIG. 2, an alignment structure of a first semiconductor substrate 102 and a second semiconductor substrate 104 may be obtained when the first wafer 202W is aligned with the second wafer 204W such that a center 202C of the first wafer 202W and a center 204C of the second wafer 204W are in one vertical line in a vertical direction (Z direction of FIG. 2). Accordingly, a Young's modulus of an arbitrary crystal orientation extending parallel to a frontside surface 102F of the first semiconductor substrate 102 (e.g., a crystal orientation in a first radial direction RB1) may be different from a Young's modulus of a crystal orientation that overlaps the arbitrary crystal orientation in the vertical direction (Z direction) and extends parallel to the arbitrary crystal orientation (e.g., a crystal orientation in a second radial direction RB2) in the second semiconductor substrate 104. Therefore, due to a combination of property anisotropy of the first semiconductor substrate 102 and property isotropy of the second semiconductor substrate 104, non-uniform mechanical deformation (e.g., distortion) and overlay deterioration may be minimized during the process of manufacturing the IC device 100.

Referring back to FIG. 2, the IC device 100 may further include a bonding layer BL between the first BEOL structure BS1 and the second semiconductor substrate 104. For example, the bonding layer BL may contact the first BEOL structure BS1 and the second semiconductor substrate 104. The bonding layer BL may be formed of or include a silicon oxide film, a silicon nitride film, a silicon carbonitride film, or a combination thereof, without being limited thereto.

In embodiments, the IC device 100 shown in FIG. 2 may constitute a portion of a logic chip, such as an analog-to-digital converter (ADC) and an application-specific IC (ASIC); a memory chip, such as a volatile memory (e.g., dynamic random access memory (DRAM)), a non-volatile memory (e.g., read-only memory (ROM)), and flash memory; an application processor chip, such as a central processor (e.g., a central processing unit (CPU)), a graphics processor (e.g., a graphics processing unit (GPU)), a digital signal processor, a cryptographic processor, a microprocessor, and a microcontroller; and/or a power management chip, such as a power management IC (PMIC).

Figure 8A:
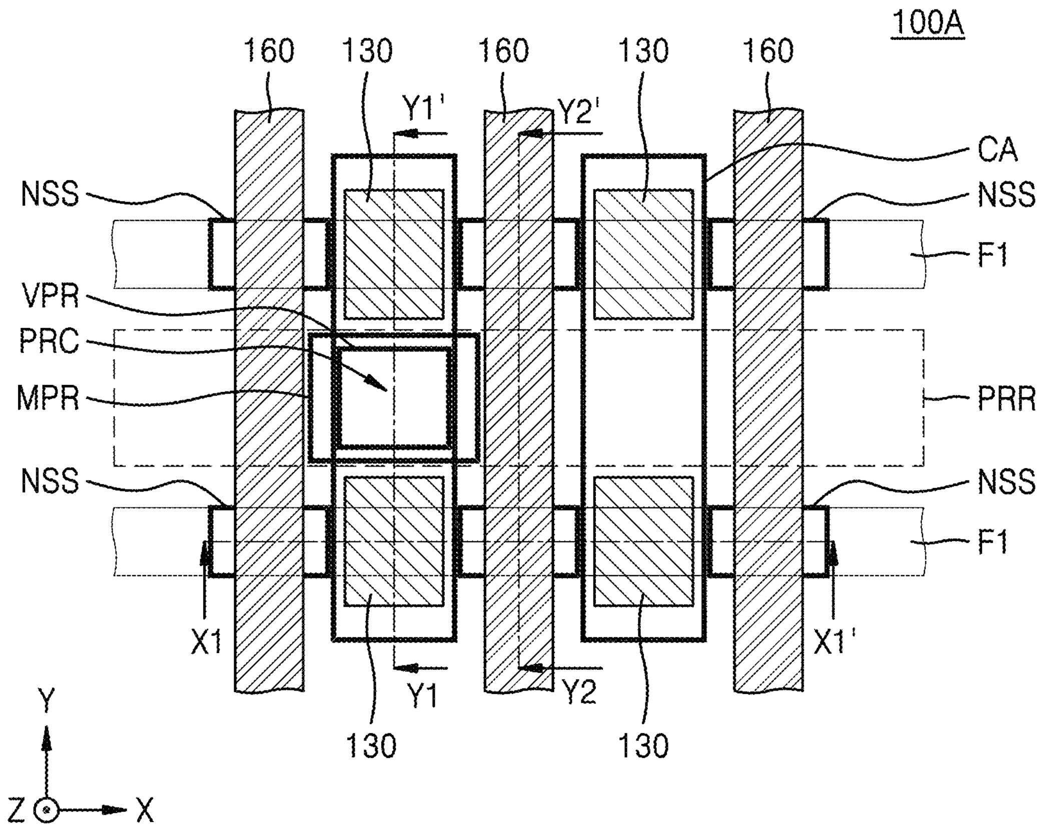
FIG. 8A is a plan layout diagram of a partial region of an IC device according to example embodiments.
Figure 8B:
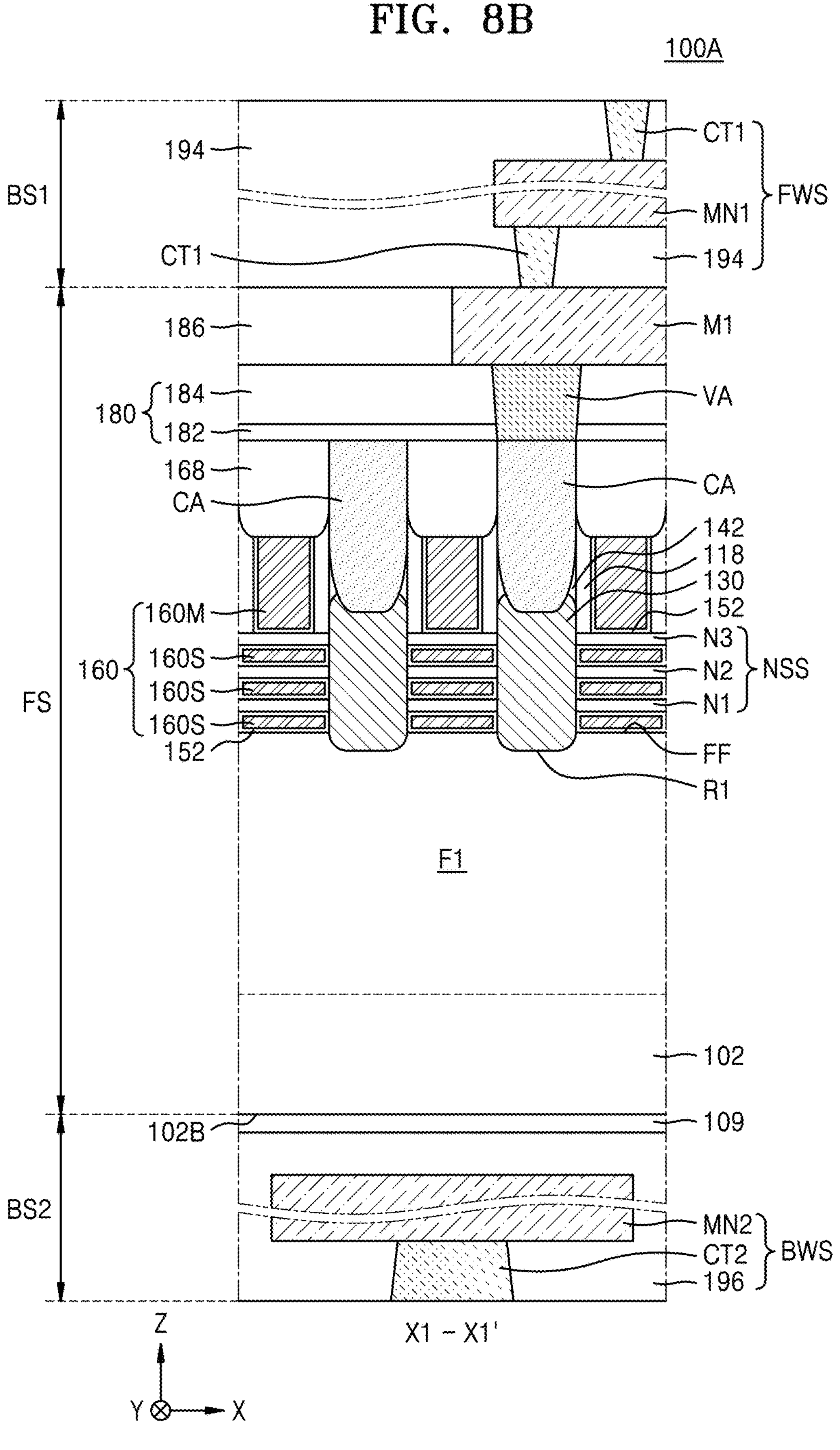
FIG. 8B is a cross-sectional view taken along line X1-X1' of FIG. 8A.
Figure 8C:
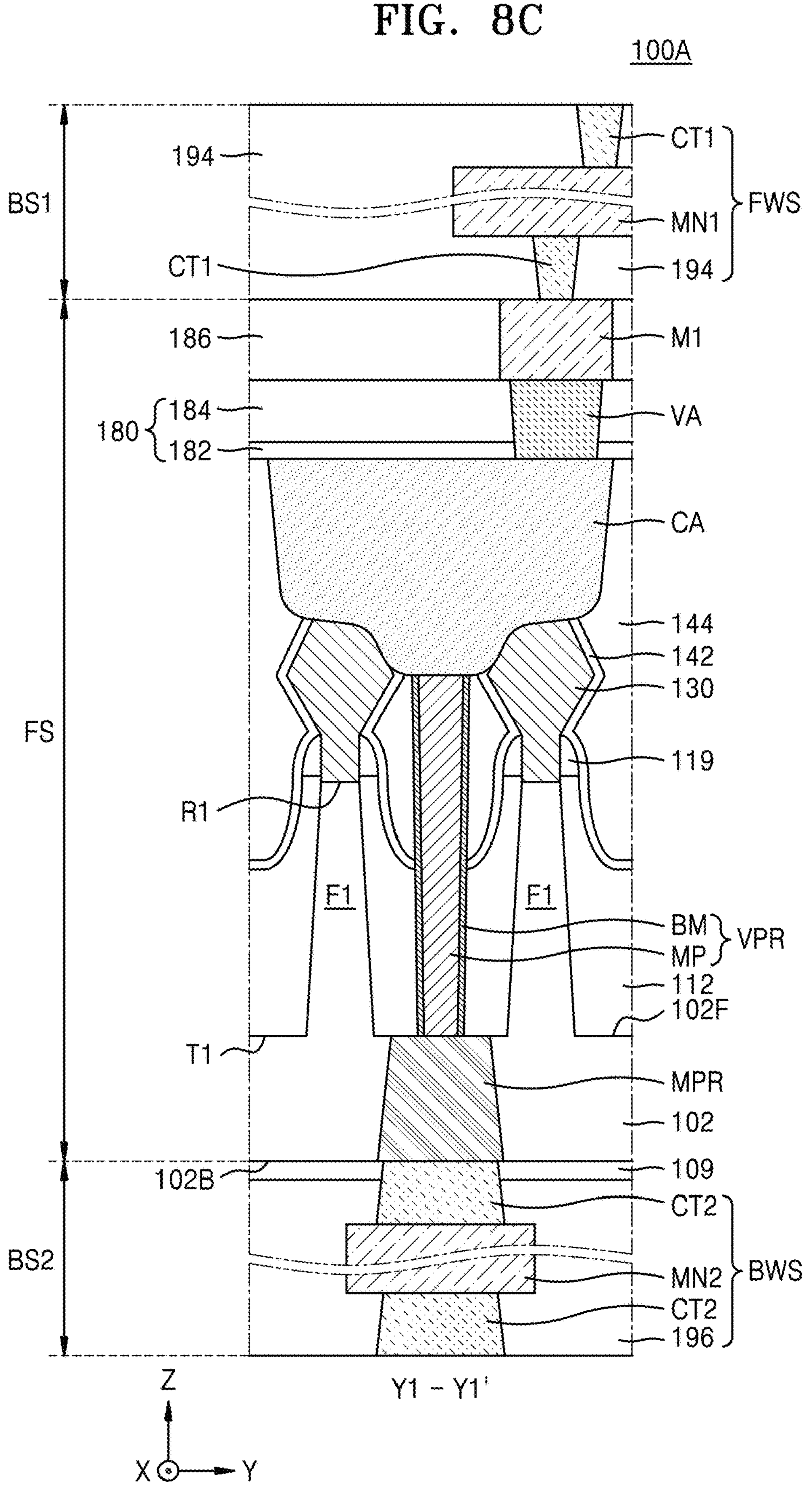
FIG. 8C is a cross-sectional view taken along line Y1-Y1' of FIG. 8A.
Figure 8D:
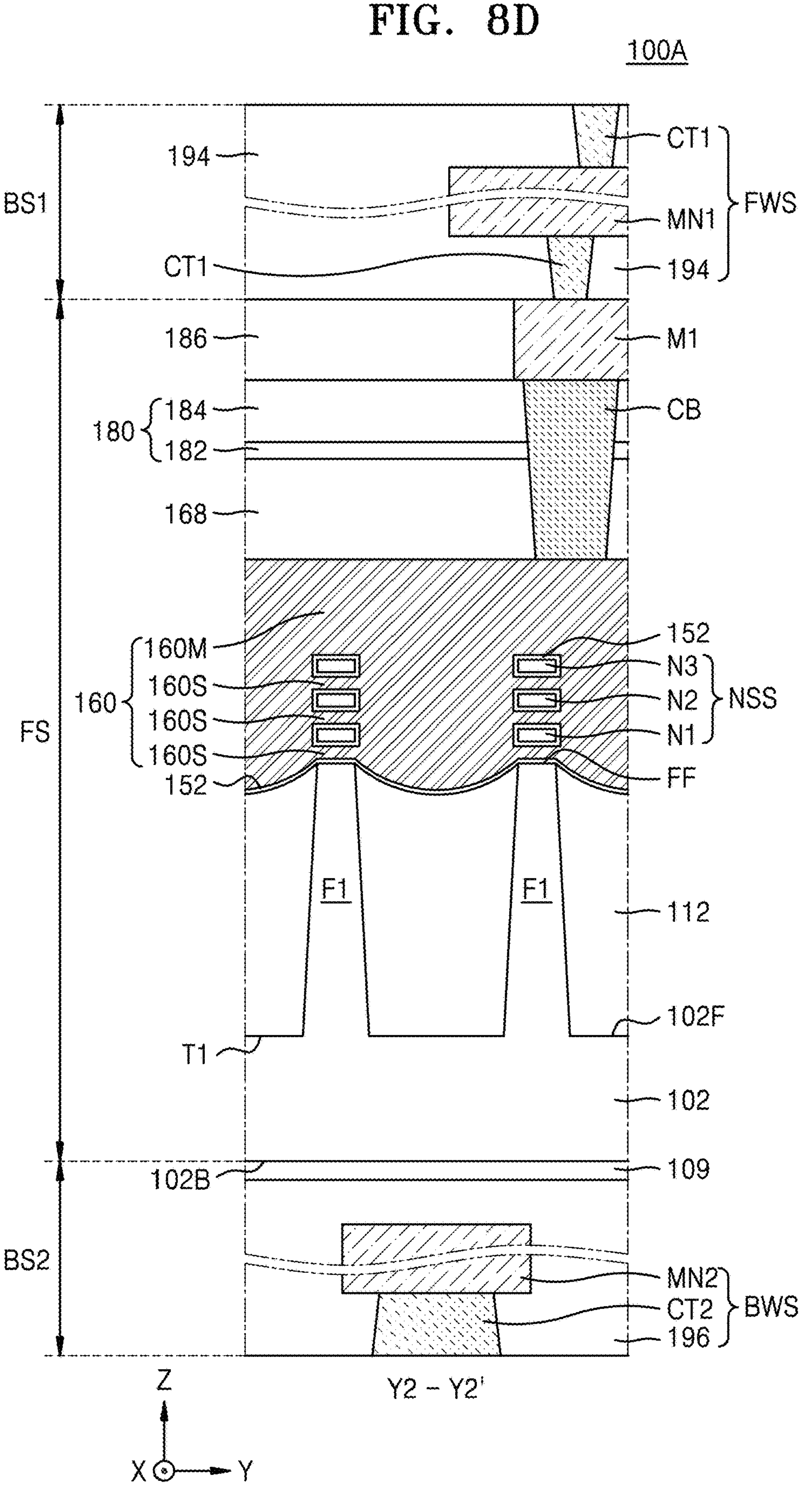
FIG. 8D is a cross-sectional view taken along line Y2-Y2' of FIG. 8A.

FIGS. 8A to 8D are diagrams of an IC device 100A according to example embodiments, illustrating a specific configuration of an example of portion "EX1" of FIG. 2. More specifically, FIG. 8A is a plan layout diagram of a partial region of the IC device 100A. FIG. 8B is a cross-sectional view taken along line X1-X1' of FIG. 8A. FIG. 8C is a cross-sectional view taken along line Y1-Y1' of FIG. 8A. FIG. 8D is a cross-sectional view taken along line Y2-Y2' of FIG. 8A. The IC device 100A including a field-effect transistor (FET) having a gate-all-around structure including an active region of a nanowire or nanosheet type and a gate surrounding the active region is described with reference to FIGS. 8A to 8D. In FIGS. 8A to 8D, the same reference numerals are used to denote the same elements as in FIG. 2, and repeated descriptions thereof are omitted here. Of the IC device 100A, components shown in FIGS. 8A to 8D may constitute some of the plurality of cells LC shown in FIG. 1.

Referring to FIGS. 8A to 8D, a first semiconductor substrate 102 may include a conductive region, for example, a doped well or a doped structure.

A plurality of fin-type active regions F1 may protrude from a frontside surface 102F of the first semiconductor substrate 102 in a vertical direction (Z direction). In some embodiments, the plurality of fin-type active regions F1 may be part of the first semiconductor substrate 102 (e.g., formed by etching the first semiconductor substrate 102) or may be formed on the first semiconductor substrate 102 (e.g., an epitaxial layer grown from the first semiconductor substrate 102). The plurality of fin-type active regions F1 may extend lengthwise in a first lateral direction (X direction) on the frontside surface 102F of the first semiconductor substrate 102 and may be spaced apart from each other in a second lateral direction (Y direction), which is perpendicular to the first lateral direction (X direction). A plurality of trench regions T1 may be defined by the plurality of fin-type active regions F1 on the frontside surface 102F of the first semiconductor substrate 102.

As shown in FIG. 8A, the IC device 100A may include a power rail region PRR. The power rail region PRR may be spaced apart from the plurality of fin-type active regions F1 in the second lateral direction (Y direction) and may extend lengthwise in the first lateral direction (X direction). A power rail wiring MPR may be in a portion of the power rail region PRR, which is adjacent to a backside surface 102B of the first semiconductor substrate 102. In embodiments, the power rail wiring MPR may constitute the ground line VSS shown in FIG. 1. The power rail wiring MPR may pass through a portion of the first semiconductor substrate 102 from the backside surface 102B of the first semiconductor substrate 102 in the vertical direction (Z direction). The power rail region PRR and the power rail wiring MPR may constitute the second BEOL structure BS2 shown in FIG. 2.

In embodiments, the power rail wiring MPR may include a metal wiring layer. In other embodiments, the power rail wiring MPR may include a metal wiring layer and a conductive barrier film surrounding the metal wiring layer. The metal wiring layer may be formed of or include Ru, Co, W, or a combination thereof. The conductive barrier film may be formed of or include titanium (Ti), titanium nitride (TiN), tantalum (Ta), tantalum nitride (TaN), or a combination thereof.

As shown in FIGS. 8C and 8D, a device isolation film 112 may be between two adjacent ones of the plurality of fin-type active regions F1. The device isolation film 112 may fill the plurality of trench regions T1 and cover a sidewall of each of the plurality of fin-type active regions F1. For example, the device isolation film 112 may contact the frontside surface 102F of the first semiconductor substrate 102 and the side surfaces of the plurality of fin-type active regions F1. The device isolation film 112 may be formed of or include a silicon oxide film, without being limited thereto.

As shown in FIGS. 8B and 8D, a plurality of gate lines 160 may be on the plurality of fin-type active regions F1 and the device isolation film 112. Each of the plurality of gate lines 160 may extend lengthwise in the second lateral direction (Y direction) to intersect with the plurality of fin-type active regions F1. A plurality of nanosheet stacks NSS may be disposed respectively on fin top surfaces FF of the plurality of fin-type active regions F1 in regions where the plurality of fin-type active regions F1 intersect with the plurality of gate lines 160. Each of the plurality of nanosheet stacks NSS may include at least one nanosheet, which is spaced apart from the fin top surface FF of the fin-type active region F1 in the vertical direction (Z direction) and faces the fin top surface FF of the fin-type active region F1. As used herein, the term "nanosheet" refers to a conductive structure having a cross-section that is substantially perpendicular to a direction in which current flows. The nanosheet may be interpreted as including a nanowire.

Each of the plurality of nanosheet stacks NSS may include a first nanosheet N1, a second nanosheet N2, and a third nanosheet N3, which overlap each other in the vertical direction (Z direction) on the fin-type active region F1. The first nanosheet N1, the second nanosheet N2, and the third nanosheet N3 may be at different vertical distances (Z-direction distances) from the fin top surface FF of the fin-type active region F1. Each of the plurality of gate lines 160 may surround the first to third nanosheets N1, N2, and N3, which overlap each other in the vertical direction (Z direction). Each of the first nanosheet N1, the second nanosheet N2, and the third nanosheet N3 in the nanosheet stack NSS may serve as a channel region. In embodiments, each of the first nanosheet N1, the second nanosheet N2, and the third nanosheet N3 in the nanosheet stack NSS may include a Si layer, a SiGe layer, or a combination thereof.

As shown in FIGS. 8B and 8D, each of the plurality of gate lines 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and each be arranged between two adjacent ones of the first to third nanosheets N1, N2, and N3 and between the first nanosheet N1 and the fin top surface FF of the fin-type active region F1.

As shown in FIGS. 8B and 8C, a plurality of recesses R1 may be formed in the fin-type active region F1. A lowermost surface of each of the plurality of recesses R1 may be at a lower vertical level than the fin top surface FF of the fin-type active region F1. As used herein, the term "vertical level" refers to a distance from the frontside surface 102F of the first semiconductor substrate 102 in a vertical direction (Z direction or −Z direction).

A plurality of source/drain regions 130 may be inside the plurality of recesses R1. Each of the plurality of source/drain regions 130 may be on the fin-type active region F1 and be spaced apart from the frontside surface 102F of the first semiconductor substrate 102 in the vertical direction (Z direction) with the fin-type active region F1 therebetween. Each of the plurality of source/drain regions 130 may be adjacent to at least one gate line 160 selected from the plurality of gate lines 160. Each of the plurality of source/drain regions 130 may have surfaces in contact with the first to third nanosheets N1, N2, and N3 included in the nanosheet stack NSS adjacent thereto.

Each of the plurality of source/drain regions 130 may include an epitaxially grown semiconductor layer. In embodiments, each of the plurality of source/drain regions 130 may include an epitaxially grown Si layer, an epitaxially grown SiC layer, or an embedded SiGe structure including a plurality of epitaxially grown SiGe layers. When the source/drain region 130 constitutes an NMOS transistor, the source/drain region 130 may include a SiC layer doped with an n-type dopant. The n-type dopant may be selected from phosphorus (P), arsenic (As), and antimony (Sb). When the source/drain region 130 constitutes a PMOS transistor, the source/drain region 130 may include a SiGe layer doped with a p-type dopant. The p-type dopant may be selected from boron (B) and gallium (Ga).

Each of the plurality of gate lines 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). However, a material included in the plurality of gate lines 160 is not limited to the examples described above.

A gate dielectric film 152 may be between the nanosheet stack NSS and the gate line 160. The gate dielectric film 152 may contact the fin top surfaces FF of the fin-type active regions F1 and a top surface of the device isolation film 112. The gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of 9 or less. In embodiments, the interface dielectric film may be omitted. The high-k dielectric film may include a material having a higher dielectric constant than a silicon oxide film. For example, the high-k dielectric film may have a dielectric constant of about 10 to about 25. The high-k dielectric film may include hafnium oxide, without being limited thereto.

Both sidewalls of each of the plurality of sub-gate portions 160S included in the plurality of gate lines 160 may be spaced apart from the source/drain region 130 with the gate dielectric film 152 therebetween. The gate dielectric film 152 may be between the sub-gate portion 160S included in the gate line 160 and each of the first to third nanosheets N1, N2, and N3 and between the sub-gate portion 160S included in the gate line 160 and the source/drain region 130.

The plurality of nanosheet stacks NSS may be respectively on the fin top surfaces FF of the plurality of fin-type active regions F1 in regions where the plurality of fin-type active regions F1 intersect with the plurality of gate lines 160. Each of the plurality of nanosheet stacks NSS may be spaced apart from the fin-type active region F1 and face the fin top surface FF of the fin-type active region F1. A plurality of nanosheet transistors may be formed in the portions in which the plurality of fin-type active regions F1 intersect with the plurality of gate lines 160. Each of the plurality of nanosheet transistors may include an NMOS transistor, a PMOS transistor, or a combination thereof.

As shown in FIG. 8B, both sidewalls of the gate line 160 may be covered by a plurality of insulating spacers 118. Each of the plurality of insulating spacers 118 may cover a sidewall of a main gate portion 160M on the top surface of the nanosheet stack NSS. Each of the plurality of insulating spacers 118 may be spaced apart from the gate line 160 with the gate dielectric film 152 therebetween. The gate dielectric film 152 may contact the sidewall of the main gate portion 160M. As shown in FIG. 8C, a plurality of recess-side insulating spacers 119 may be on the device isolation film 112. At least some of the plurality of recess-side insulating spacers 119 may cover a sidewall of the source/drain region 130. In example embodiments, the plurality of recess-side insulating spacers 119 may contact a top surface of the device isolation film 112 and sidewalls of the source/drain regions 130. In embodiments, each of the plurality of recess-side insulating spacers 119 may be integrally connected to the insulating spacer 118 adjacent thereto. Each of the plurality of insulating spacers 118 and the plurality of recess-side insulating spacers 119 may be formed of or include silicon nitride, silicon oxide, SiCN, SiBN, SiON, SiOCN, SiBCN, SiOC, or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

A top surface of each of the gate line 160, the gate dielectric film 152, and the insulating spacer 118 may be covered by a capping insulating pattern 168. The capping insulating pattern 168 may contact top surfaces of the gate line 160, the gate dielectric film 152, and the insulating spacer 118. The capping insulating pattern 168 may be formed of or include a silicon nitride film.

The plurality of source/drain regions 130, the device isolation film 112, the plurality of insulating spacers 118, and the plurality of recess-side insulating spacers 119 may be covered by an insulating liner 142. The insulating liner 142 may contact the plurality of source/drain regions 130, the device isolation film 112, the plurality of insulating spacers 118, and the plurality of recess-side insulating spacers 119. An inter-gate dielectric film 144 may be on the insulating liner 142. The inter-gate dielectric film 144 may contact the insulating liner 142. The inter-gate dielectric film 144 may be between a pair of source/drain regions 130, which are adjacent to each other, between a pair of gate lines 160, which are adjacent to each other in the first lateral direction (X direction). In embodiments, the insulating liner 142 may be formed of or include silicon nitride, SiCN, SiBN, SiON, SiOCN, SiBCN, or a combination thereof, without being limited thereto. The inter-gate dielectric film 144 may be formed of or include a silicon oxide film, without being limited thereto. The device isolation film 112, the insulating liner 142, and the inter-gate dielectric film 144 may constitute an insulating structure.

As shown in FIGS. 8B and 8C, a plurality of source/drain contacts CA may be on the plurality of source/drain regions 130. Each of the plurality of source/drain contacts CA may be spaced apart from the frontside surface 102F of the first semiconductor substrate 102 in the vertical direction (Z direction) with the fin-type active region F1 and the source/drain region 130 therebetween.

Each of the plurality of source/drain contacts CA may be electrically connected to at least one source/drain region 130 selected from the plurality of source/drain regions 130. For example, as shown in FIG. 8C, one source/drain contact CA may be two connected source/drain regions 130 adjacent thereto, without being limited thereto. As shown in FIG. 8A, the source/drain contact CA may extend lengthwise in the second lateral direction (Y direction) between a pair of gate lines 160, which are adjacent to each other in the first lateral direction (X direction). As shown in FIG. 8B, the source/drain contact CA may be spaced apart from the main gate portion 160M of the gate line 160 adjacent thereto in the first lateral direction (X direction) with the insulating spacer 118 therebetween.

In embodiments, the source/drain region 130 and the source/drain contact CA, which are connected to each other, may be in contact with each other. In other embodiments, a metal silicide film (not shown) may be between the source/drain region 130 and the source/drain contact CA, which are connected to each other. The metal silicide film may be formed of or include a metal, which includes titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). For example, the metal silicide film may include titanium silicide, without being limited thereto.

In embodiments, the source/drain contact CA may include only a metal plug including a single metal. In other embodiments, the source/drain contact CA may include a metal plug and a conductive barrier film including the metal plug. The metal plug may be formed of or include molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof, without being limited thereto. The conductive barrier film may include a metal or a conductive metal silicide. For example, the conductive barrier film may be formed of or include titanium (Ti), tantalum (Ta), tungsten (W), titanium nitride (TiN), tantalum nitride (TaN), tungsten nitride (WN), tungsten carbon nitride (WCN), titanium silicon nitride (TiSiN), tantalum silicon nitride (TaSiN), tungsten silicon nitride (WSiN), or a combination thereof, without being limited thereto.

As shown in FIG. 8C, the IC device 100A may include a via power rail VPR, which extends lengthwise in the vertical direction (Z direction) between the power rail wiring MPR and the source/drain contact CA. The via power rail VPR may include a portion passing through an insulating structure including the device isolation film 112, the insulating liner 142, and the inter-gate dielectric film 144 in the vertical direction (Z direction) and a portion passing through a portion of the frontside surface 102F of the first semiconductor substrate 102 in the vertical direction (Z direction). The portion of the via power rail VPR, which passes through the insulating structure in the vertical direction (Z direction), may include a conductive barrier film BM and a metal plug MP surrounded by the conductive barrier film BM. The conductive barrier film BM may contact the metal plug MP. The via power rail VPR may constitute the second BEOL structure BS2 shown in FIG. 2. The metal plug MP may be formed of or include molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof, without being limited thereto. The conductive barrier film BM may be formed of or include Ti, Ta, W, TiN, TaN, WN, WCN, TiSiN, TaSiN, WSiN, or a combination thereof, without being limited thereto.

The power rail wiring MPR and the via power rail VPR may constitute a contact structure. Of the contact structure, the power rail wiring MPR may constitute a first plug portion, which passes through the first semiconductor substrate 102 in the vertical direction (Z direction), and the via power rail VPR may constitute a second plug portion, which passes through the insulating structure in the vertical direction (Z direction). An insulating spacer including an inorganic material (e.g., a silicon oxide film and a silicon nitride film) may be between the power rail wiring MPR and the first semiconductor substrate 102 and/or between the via power rail VPR and the insulating structure.

A top surface of each of the source/drain contact CA, a plurality of capping insulating patterns 168, and the inter-gate dielectric film 144 may be covered by an upper insulating structure 180. The upper insulating structure 180 may include an etch stop film 182 and an upper insulating film 184, which are sequentially stacked on each of the source/drain contact CA, the plurality of capping insulating patterns 168, and the inter-gate dielectric film 144. The etch stop film 182 may be formed of or include silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The upper insulating film 184 may be formed of or include an oxide film, a nitride film, an ultralow-k (ULK) film having an ultralow dielectric constant K of about 2.2 to about 2.4, or a combination thereof. For example, the upper insulating film 184 may be formed of or include a tetraethyl orthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIGS. 8B and 8C, a source/drain via contact VA may be on the source/drain contact CA. The source/drain via contact VA may pass through the upper insulating structure 180 and contact the source/drain contact CA. Each of the plurality of source/drain regions 130 may be electrically connected to the source/drain via contact VA through the source/drain contact CA. A bottom surface of the source/drain via contact VA may be in contact with the top surface of the source/drain contact CA.

As shown in FIG. 8D, a gate contact CB may be on the gate line 160. The gate contact CB may pass through the upper insulating structure 180 and the capping insulating pattern 168 in the vertical direction (Z direction) and be connected to the gate line 160. A bottom surface of the gate contact CB may be in contact with a top surface of the gate line 160.

Each of the source/drain via contact VA and the gate contact CB may include a contact plug, which includes molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof, but a constituent material of the contact plug is not limited thereto. In embodiments, the source/drain via contact VA and the gate contact CB may further include a conductive barrier pattern surrounding a portion of the contact plug. The conductive barrier pattern included in the source/drain via contact VA and the gate contact CB may include a metal or a metal silicide. For example, the conductive barrier pattern may be formed of or include Ti, Ta, W, TiN, TaN, WN, WCN, TiSiN, TaSiN, WSiN, or a combination thereof, without being limited thereto.

A top surface of each of the upper insulating structure 180, the source/drain via contact VA, and the gate contact CB may be covered by an interlayer insulating film 186. For example, the interlayer insulating film 186 may contact top surfaces of the upper insulating structure 180, the source/drain via contact VA, and the gate contact CB. A constituent material of the interlayer insulating film 186 is substantially the same as a constituent material of the upper insulating film 184. The plurality of upper wiring layers M1 may pass through the interlayer insulating film 186. Each of the plurality of upper wiring layers M1 may be connected to the source/drain via contact VA located thereunder or the gate contact CB. Top and bottom surfaces of the plurality of upper wiring layers M1 may be coplanar with respective top and bottom surfaces of the interlayer insulating film 186. The plurality of upper wiring layers M1 may be formed of or include molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

A frontside wiring structure FWS may be on the plurality of upper wiring layers M1 and the interlayer insulating film 186. The frontside wiring structure FWS may include a plurality of wiring layers MN1, a plurality of via contacts CT1, and an interlayer insulating film 194 covering the plurality of wiring layers MN1 and the plurality of via contacts CT1. The via power rail VPR may be connected to a selected one of the plurality of wiring layers MN1 through the source/drain contact CA, the source/drain via contact VA, the upper wiring layer M1, and the via contact CT1. Constituent materials of the plurality of wiring layers MN1 and the plurality of via contacts CT1 are substantially the same as those of the plurality of upper wiring layers M1, which have been described above. A constituent material of the interlayer insulating film 194 is substantially the same as that of the upper insulating film 184, which has been described above.

The backside surface 102B of the first semiconductor substrate 102 may be covered by a backside insulating film 109. For example, the backside insulating film 109 may contact the backside surface 102B of the first semiconductor substrate 102. The backside insulating film 109 may be formed of or include a silicon oxide film, a silicon nitride film, a silicon carbide film, a low-k dielectric film, or a combination thereof. The low-k dielectric film may be formed of or include fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof, without being limited thereto.

A backside wiring structure BWS may be on the backside insulating film 109. The backside wiring structure BWS may include a plurality of wiring layers MN2, a plurality of via contacts CT2, and an interlayer insulating film 196 covering the plurality of wiring layers MN2 and the plurality of via contacts CT2. A selected one of the plurality of via contacts CT2 may have one end in contact through the backside insulating film 109 and another end in contact with a selected one of the plurality of wiring layers MN2. The power rail wiring MPR may be connected to a selected one of the plurality of wiring layers MN2 through the one via contact CT2. Constituent materials of the plurality of wiring layers MN2 and the plurality of via contacts CT2 are substantially the same as those of the plurality of upper wiring layers M1, which have been described above. A constituent material of the interlayer insulating film 196 is substantially the same as that of the upper insulating film 184, which is described above.

Figure 9A:
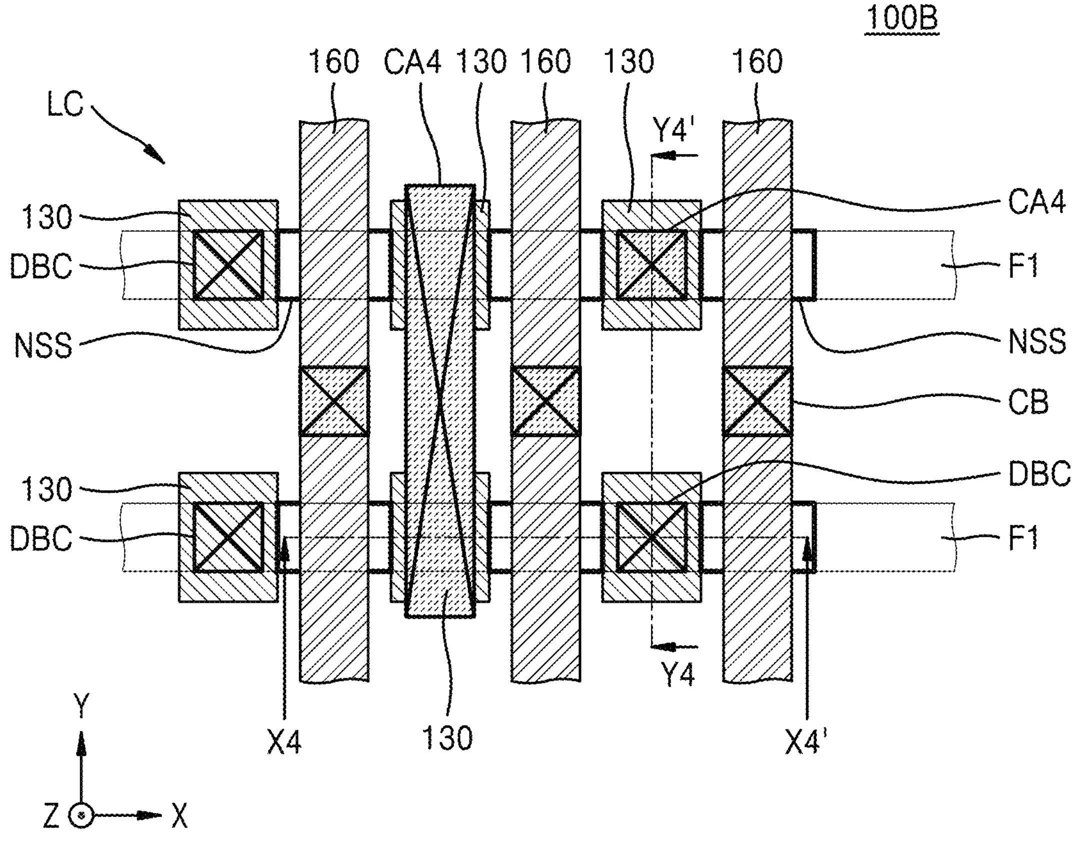
FIG. 9A is a plan layout diagram of a partial region of an IC device according to example embodiments.
Figure 9B:
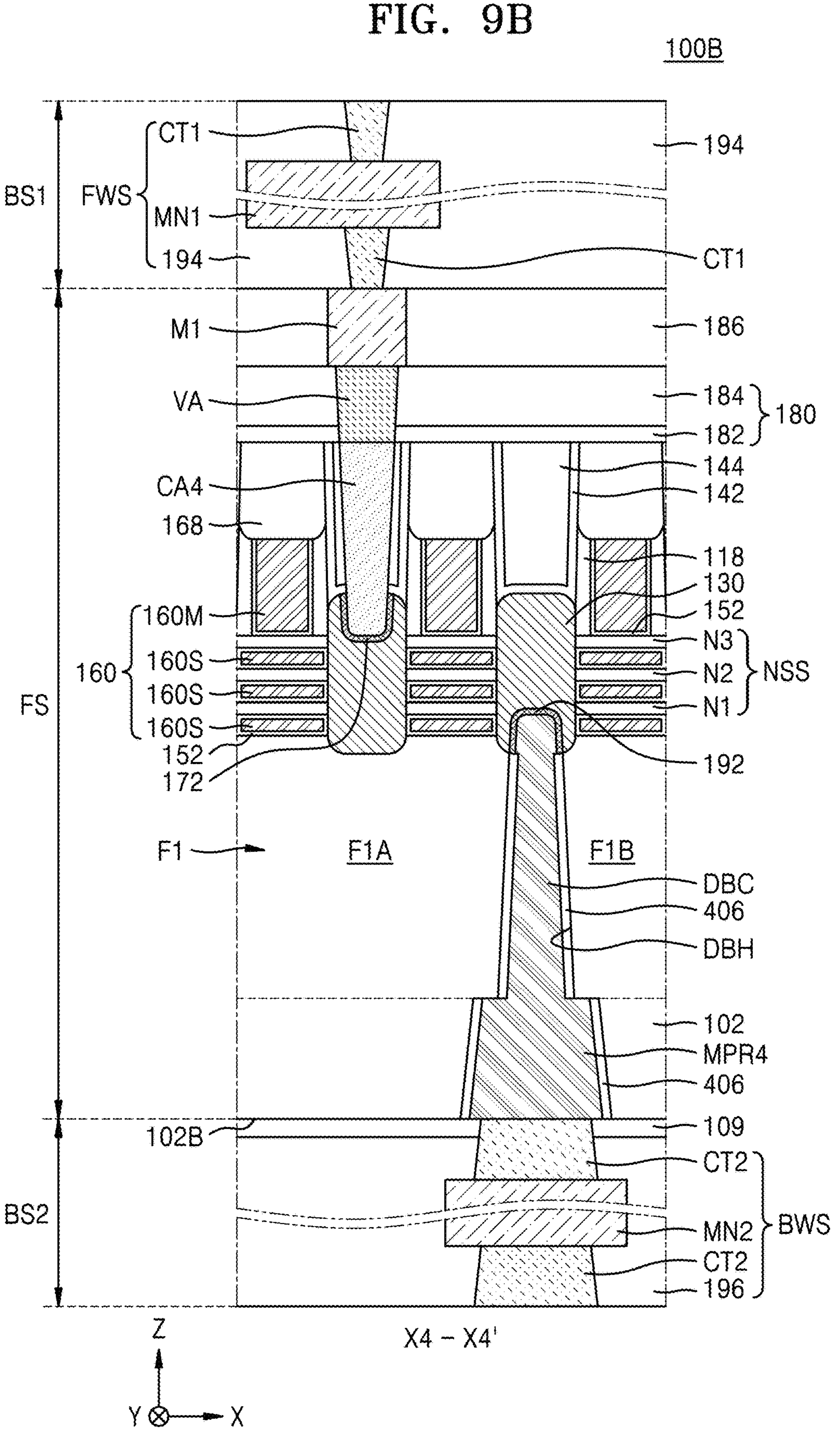
FIG. 9B is a cross-sectional view taken along line X4-X4' of FIG. 9A.
Figure 9C:
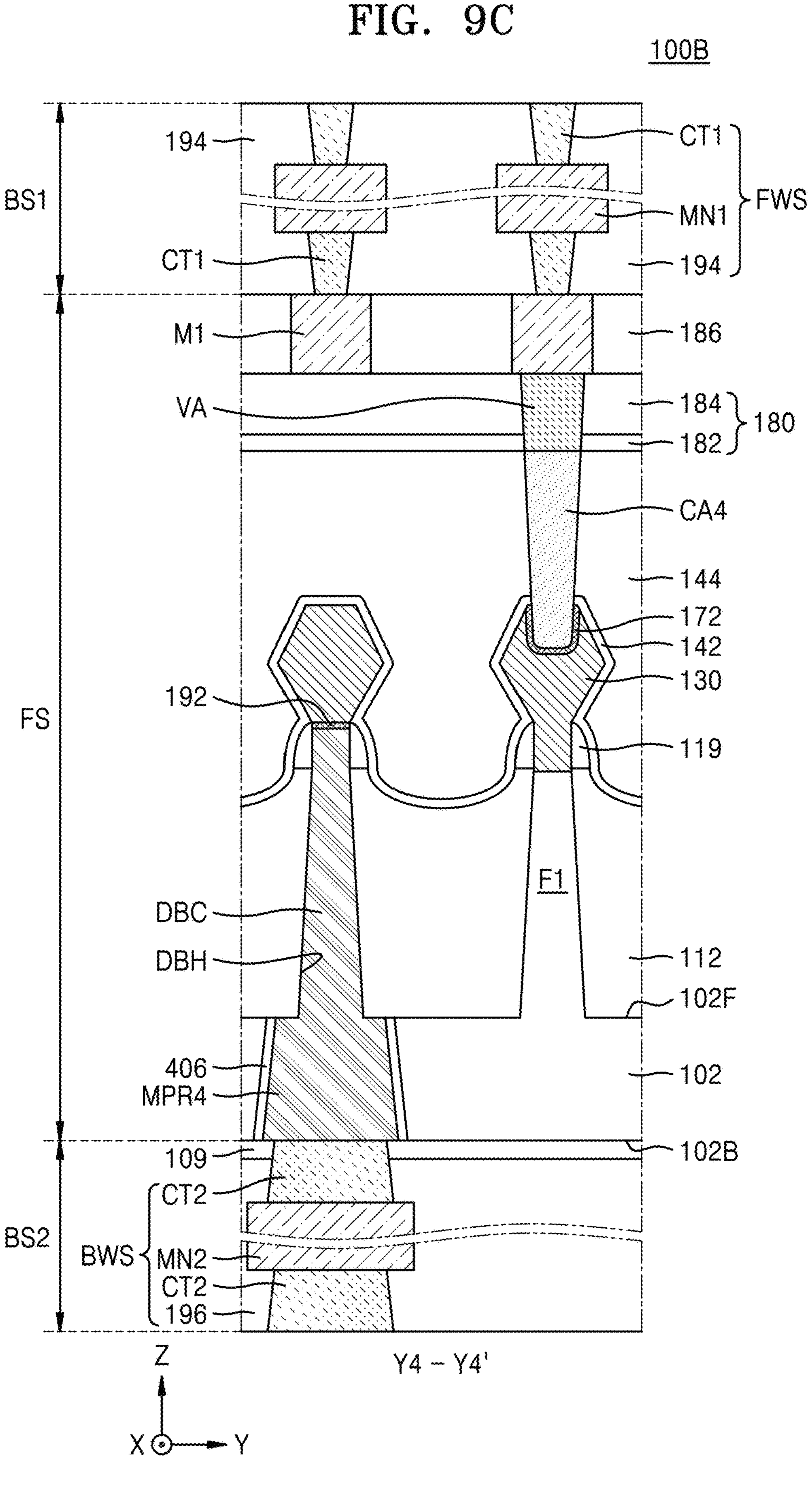
FIG. 9C is a cross-sectional view taken along line Y4-Y4' of FIG. 9A.

FIGS. 9A to 9C are diagrams of an IC device 100B according to example embodiments, illustrating a specific configuration of another example of portion "EX1" of FIG. 2. More specifically, FIG. 9A is a plan layout diagram of a partial region of the IC device 100B. FIG. 9B is a cross-sectional view taken along line X4-X4' of FIG. 9A. FIG. 9C is a cross-sectional view taken along line Y4-Y4' of FIG. 9A. In FIGS. 9A to 9C, the same reference numerals are used to denote the same elements as in FIGS. 2 and 8A to 8D, and repeated descriptions thereof are omitted here.

Referring to FIGS. 9A to 9C, the IC device 100B may constitute some of the plurality of cells LC shown in FIG. 1. The IC device 100B may substantially have the same configuration as the IC device 100A described with reference to FIGS. 8A to 8D. However, the IC device 100B may include a contact structure including a power rail wiring MPR4 and a backside source/drain contact DBC.

A selected one of the plurality of fin-type active regions F1 may include a first fin portion F1A and a second fin portion FIB, which are spaced apart from each other in a first lateral direction (X direction), with the backside source/drain contact DBC included in the contact structure therebetween and extend lengthwise in a straight line in the first lateral direction (X direction). Each of the first fin portion F1A and the second fin portion FIB may have a sidewall covered by a device isolation film 112. The device isolation film 112 may constitute an insulating structure.

A plurality of gate lines 160 may be on the plurality of fin-type active regions F1. Each of the plurality of gate lines 160 may extend lengthwise in a second lateral direction (Y direction), which intersects with the first lateral direction (X direction). A plurality of nanosheet stacks NSS may be respectively over the plurality of fin-type active regions F1 in regions where the plurality of fin-type active regions F1 intersect with the plurality of gate lines 160.

A plurality of source/drain regions 130 may be on the plurality of fin-type active regions F1. Each of the plurality of source/drain regions 130 may be adjacent to at least one gate line 160 selected from the plurality of gate lines 160. Each of the plurality of source/drain regions 130 may be in contact with a first nanosheet N1, a second nanosheet N2, and a third nanosheet N3, which are included in the nanosheet stack NSS adjacent thereto.

As shown in FIG. 9C, a plurality of recess-side insulating spacers 119 may be on a top surface of the device isolation film 112. At least some of the plurality of recess-side insulating spacers 119 may cover a sidewall of the source/drain region 130. In embodiments, each of the plurality of recess-side insulating spacers 119 may be integrally connected to the insulating spacer 118 adjacent thereto.

A metal silicide film 172 may be formed on top surfaces of some selected ones of the plurality of source/drain regions 130 toward the upper insulating structure 180, and a metal silicide film 172 may be formed on bottom surfaces of some other selected ones of the plurality of source/drain regions 130 toward a first semiconductor substrate 102. The plurality of source/drain regions 130 and the device isolation film 112 may be covered by an insulating liner 142. An inter-gate dielectric film 144 may be on the insulating liner 142.

As shown in FIG. 9C, a plurality of frontside source/drain contacts CA4 may be on the fin-type active region F1. Each of the plurality of frontside source/drain contacts CA4 may be electrically connected to selected ones of the plurality of source/drain regions 130. Each of the plurality of frontside source/drain contacts CA4 may be spaced apart from the fin-type active region F1 in a vertical direction (Z direction) with the source/drain region 130 therebetween.

Each of the plurality of frontside source/drain contacts CA4 may pass through the inter-gate dielectric film 144 and the insulating liner 142 in the vertical direction (Z direction) and contact the metal silicide film 172. As shown in FIG. 9B, the frontside source/drain contact CA4 may be spaced apart from a main gate portion 160M of the gate line 160 in the first lateral direction (X direction) with the insulating spacer 118 therebetween. Details of the frontside source/drain contact CA4 are substantially the same as those of the source/drain contact CA described with reference to FIGS. 2 and 3A to 3B.

A plurality of backside source/drain contacts DBC may be at a backside, which is opposite to a frontside at which the frontside source/drain contact CA is located, with the plurality of source/drain regions 130 therebetween. Each of the plurality of backside source/drain contacts DBC may be electrically connected to some other source/drain regions 130, which are selected from the plurality of source/drain regions 130 and are not connected to the frontside source/drain contact CA4.

Each of the plurality of backside source/drain contacts DBC may pass through a selected one of the plurality of fin-type active regions F1 in the vertical direction (Z direction). As described above, the selected fin-type active region F1 may include a first fin portion F1A and a second fin portion F1B, which are spaced apart from each other in the first lateral direction (X direction) with the backside source/drain contact DBC therebetween and extend lengthwise in a straight line in the first lateral direction (X direction).

In the plurality of source/drain regions 130, the source/drain region 130 to which the frontside source/drain contact CA4 is connected and the source/drain region 130 to which the backside source/drain contact DBC is connected may be spaced apart from each other in a lateral direction, for example, the first lateral direction (X direction) or the second lateral direction (Y direction).

Each of the plurality of backside source/drain contacts DBC may have sidewalls facing each of the fin-type active regions F1, which is penetrated by the backside source/drain contact DBC in the vertical direction (Z direction), and the device isolation film 112 adjacent thereto.

As shown in FIG. 9B, the plurality of gate lines 160 may include a gate line 160 located on the first fin portion F1A and a gate line 160 located on the second fin portion F1B. Each of the plurality of frontside source/drain contacts CA4 may be connected to the source/drain region 130 located on the first fin portion F1A or the second fin portion F1B.

As shown in FIG. 9C, the device isolation film 112 may cover both sidewalls of each of the first fin portion F1A and the second fin portion FIB in the second lateral direction (Y direction) and define a width of a contact space DBH in the second lateral direction (Y direction). The backside source/drain contact DBC may overlap the source/drain region 130 in the vertical direction (Z direction) in the contact space DBH and extend lengthwise in the vertical direction (Z direction) in the contact space DBH.

Widths of the backside source/drain contact DBC in the first lateral direction (X direction) and the second lateral direction (Y direction) may gradually increase toward the first semiconductor substrate 102 in the vertical direction (Z direction). As shown in FIGS. 9B and 9C, widths of the frontside source/drain contact CA4 in the first lateral direction (X direction) and the second lateral direction (Y direction) may gradually increase away from the first semiconductor substrate 102 in the vertical direction (Z direction).

A metal silicide film 192 may be between the backside source/drain contact DBC and the source/drain region 130. The metal silicide film 192 may contact the backside source/drain contact DBC and the source/drain region 130. Details of the metal silicide film 192 are substantially the same as those of the metal silicide film 172, which are described above.

As shown in FIG. 9C, in the contact space DBH, sidewalls of the backside source/drain contact DBC, which face the device isolation film 112, may be in contact with the device isolation film 112.

In the contact space DBC, an insulating film 406 may be between the first fin portion F1A and the backside source/drain contact DBC and between the second fin portion FIB and the backside source/drain contact DBC. Also, the insulating film 406 may be between the first semiconductor substrate 102 and the power rail wiring MPR4. The insulating film 406 may be formed of or include a silicon oxide film.

In the IC device 100B, the power rail wiring MPR4 may pass through the first semiconductor substrate 102 in the vertical direction (Z direction) from a backside surface 102B of the first semiconductor substrate 102 to a frontside surface 102F thereof and be connected to the backside source/drain contact DBC. The backside source/drain contact DBC may include a first end portion connected to the power rail wiring MPR4 and a second end portion connected to the source/drain region 130 through the metal silicide film 192. In embodiments, the power rail wiring MPR4 may be integrally connected to the backside source/drain contact DBC. In embodiments, the power rail wiring MPR4 and the backside source/drain contact DBC may be formed of or include the same metal as each other. In embodiments, each of the power rail wiring MPR4 and the backside source/drain contact DBC may include a metal plug, which is formed of or includes molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof.

The power rail wiring MPR4 and the backside source/drain contact DBC may constitute a contact structure. The power rail wiring MPR4 passing through the first semiconductor substrate 102 in the vertical direction (Z direction) may constitute a first plug portion of the contact structure, and the backside source/drain contact DBC may constitute a second plug portion of the contact structure.

As shown in FIGS. 9B and 9C, a top surface of each of the plurality of frontside source/drain contacts CA4, a plurality of capping insulating patterns 168, and an inter-gate dielectric film 144 may be covered by an upper insulating structure 180. The upper insulating structure 180 may include an etch stop film 182 and an upper insulating film 184. A plurality of source/drain via contacts VA may be on the plurality of frontside source/drain contacts CA4. Each of the plurality of source/drain via contacts VA may pass through the upper insulating structure 180 and contact the frontside source/drain contact CA4. From among the plurality of source/drain regions 130, the source/drain region 130 connected to the frontside source/drain contact CA4 may be electrically connected to the source/drain via contact VA through the metal silicide film 172 and the frontside source/drain contact CA4. A top surface of the upper insulating structure 180 may be covered by an interlayer insulating film 186. A plurality of upper wiring layers M1 may pass through the interlayer insulating film 186. Each of the plurality of upper wiring layers M1 may be connected to a selected one of the plurality of source/drain via contacts VA located thereunder or a selected one of the plurality of gate contacts (refer to CB in FIG. 9A).

A frontside wiring structure FWS may be on the plurality of upper wiring layers M1 and the interlayer insulating film 186. The backside surface 102B of the first semiconductor substrate 102 may be covered by a backside insulating film 109. A backside wiring structure BWS may be on the backside insulating film 109.

The IC devices 100, 100A, and 100B described with reference to FIGS. 2 to 9C may each include the first semiconductor substrate 102 and the second semiconductor substrate 104, which are spaced apart from each other in the vertical direction (Z direction) with the FEOL structure FS and the first BEOL structure BS1 therebetween and overlap each other in the vertical direction (Z direction). Also, a Young's modulus of an arbitrary crystal orientation extending parallel to the frontside surface 102F of the first semiconductor substrate 102 may be different from a Young's modulus of a crystal orientation, which overlaps the arbitrary crystal orientation in the vertical direction (Z direction) and extends parallel to the arbitrary crystal orientation in the second semiconductor substrate 104. Accordingly, in the IC devices 100, 100A, and 100B according to the inventive concept, even when the first semiconductor substrate 102 gradually becomes thinner and sizes of patterns to be formed on the first semiconductor substrate 102 become smaller, bending distortion of the first semiconductor substrate 102 and overlay errors in the patterns formed at different vertical levels on the first semiconductor substrate 102 may be minimized. Therefore, according to the inventive concept, critical dimension (CD) uniformity of patterns required to manufacture the IC devices 100, 100A, and 100B may improve, and reliability of the IC devices 100, 100A, and 100B may improve.

Figure 10:
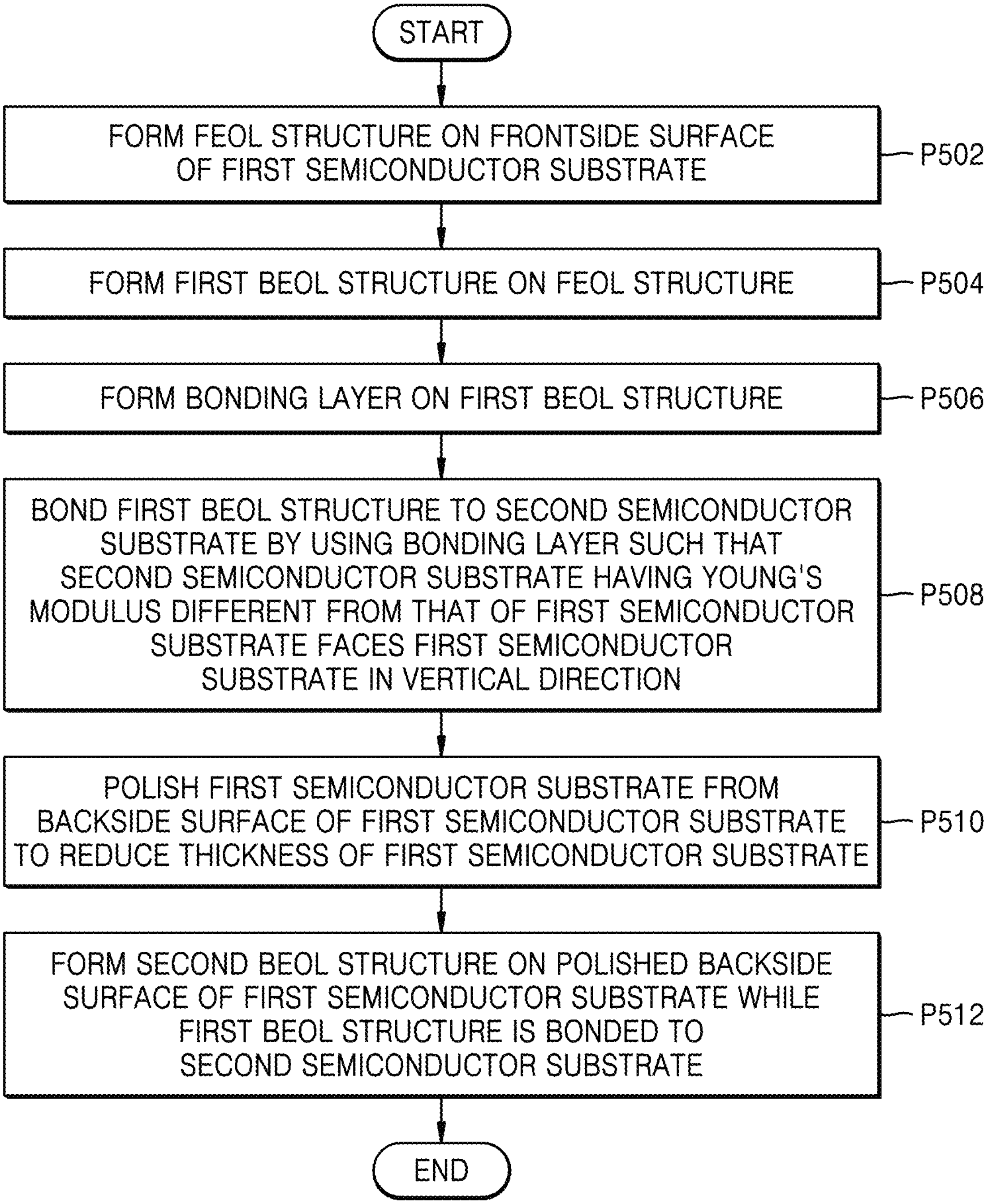
FIG. 10 is a flowchart of a method of manufacturing an IC device according to example embodiments.

FIG. 10 is a flowchart of a method of manufacturing an IC device, according to example embodiments. FIGS. 11A to 11F are cross-sectional views of a process sequence of a method of manufacturing an IC device, according to example embodiments. A method of manufacturing the IC device 100 described with reference to FIG. 2 is described with reference to FIGS. 10 and 11A to 11F. In FIGS. 11A to 11F, the same reference numerals are used to denote the same elements as in FIG. 2, and repeated descriptions thereof are omitted here.

Figure 11A:
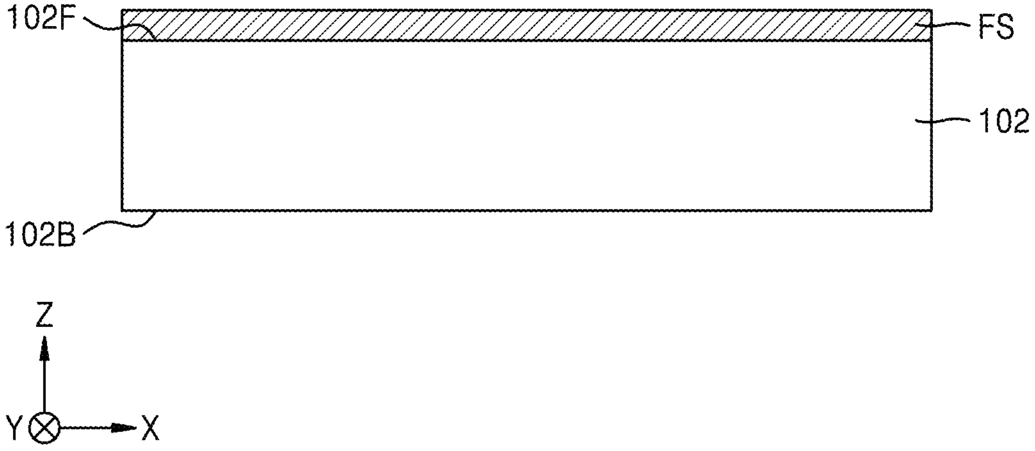
FIGS. 11A to 11F are cross-sectional views of a process sequence of a method of manufacturing an IC device according to example embodiments.

Referring to FIGS. 10 and 11A, in process P502, a first semiconductor substrate 102 may be prepared, and an FEOL structure FS may be formed on a frontside surface 102F of the first semiconductor substrate 102.

In embodiments, the first semiconductor substrate 102 may include the frontside surface 102F having a (100) crystal plane. For example, the first semiconductor substrate 102 may include the first wafer 102W described with reference to FIGS. 4A and 4B.

In embodiments, the FEOL structure FS may be formed to include components of the IC device 100 described with reference to FIGS. 8A to 8D and/or components of the IC device 100B described with reference to FIGS. 9A to 9C.

Figure 11B:
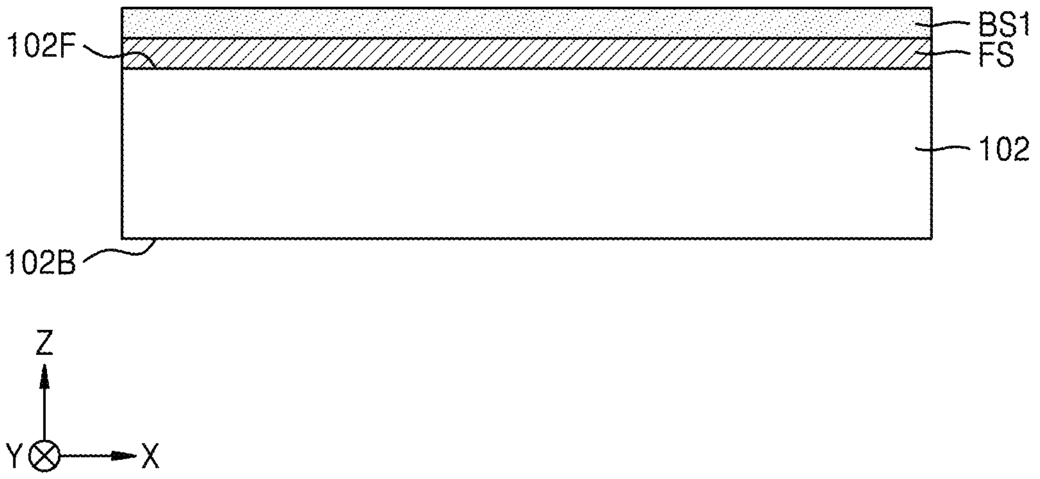

Referring to FIGS. 10 and 11B, in process P504, a first BEOL structure BS1 may be formed on the FEOL structure FS. In embodiments, the first BEOL structure BS1 may be formed to include the frontside wiring structure FWS described with reference to FIGS. 8A to 8D and 9A to 9C.

Figure 11C:
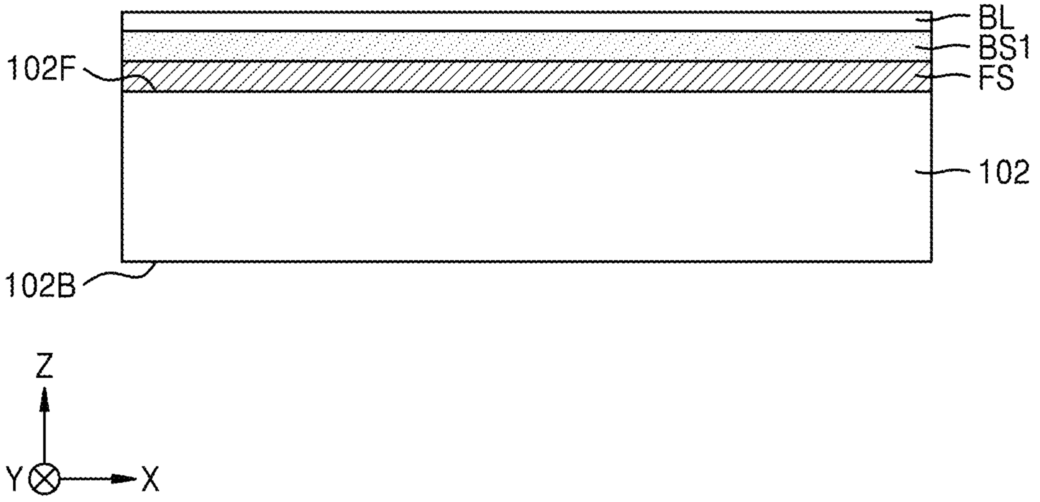

Referring to FIGS. 10 and 11C, in process P506, a bonding layer BL may be formed on the first BEOL structure BS1.

Figure 11D:
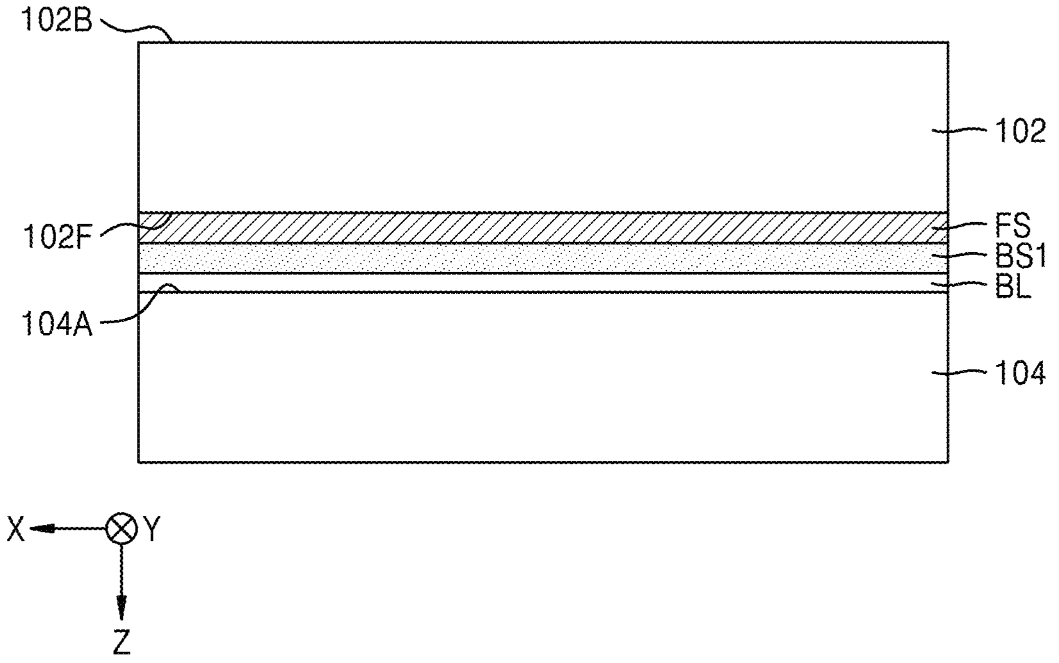

Referring to FIGS. 10 and 11D, in process P508, the first BEOL structure BS1 and a second semiconductor substrate 104 may be bonded to each other by using the bonding layer BL such that a second semiconductor substrate 104 having a Young's modulus different from that of the first semiconductor substrate 102 faces the first semiconductor substrate 102 in a vertical direction (Z direction).

In embodiments, a main surface 104A of the second semiconductor substrate 104, which faces the first semiconductor substrate 102, may have a (100) crystal plane. For example, the second semiconductor substrate 104 may include the second wafer 104W described with reference to FIGS. 5A and 5B.

The bonding of the first BEOL structure BS1 and the second semiconductor substrate 104 to each other may be performed by using the first wafer 102W describe with reference to FIGS. 4A and 4B as the first semiconductor substrate 102 and using the second wafer 104W described with reference to FIGS. 5A and 5B as the second semiconductor substrate 104. In this case, in process P508 of FIG. 10, the bonding of the first BEOL structure BS1 to the second semiconductor substrate 104 may include aligning the first wafer 102W with the second wafer 104W such that a first notch 102N of the first wafer 102W in a <110> direction and a second notch 104N of the second wafer 104W in a <100> direction overlap each other in the vertical direction (Z direction) and a first radial direction RA1 from a center 102C of the first wafer 102W and a second radial direction RA2 from a center 104C of the second wafer 104W are in the same direction. The second radial direction RA2 may correspond to a direction rotated at an angle (e.g., 45°) selected within a range of about 40° to about 50° from the first radial direction RA1.

In embodiments, in process P508 of FIG. 10, the bonding of the first BEOL structure BS1 to the second semiconductor substrate 104 may be performed by using the first wafer 102W described with reference to FIGS. 4A and 4B as the first semiconductor substrate 102 and using the second wafer 104W described with reference to FIGS. 5A and 5B as the second semiconductor substrate 104. In this case, in process P508 of FIG. 10, the bonding of the first BEOL structure BS1 to the second semiconductor substrate 104 may include aligning the first semiconductor substrate 102 with the second semiconductor substrate 104 such that the <110> direction extending from and parallel to the frontside surface 102F of the first semiconductor substrate 102 including the first wafer 102W and the <100> direction extending from and parallel to the main surface 104A of the second semiconductor substrate 104 including the second wafer 104W overlap each other in the vertical direction (Z direction) and extend parallel to each other.

In other embodiments, the main surface 104A of the second semiconductor substrate 104, which faces the first semiconductor substrate 102, may have a (111) crystal plane. For example, the second semiconductor substrate 104 may include the second wafer 204W described with reference to FIG. 6B.

The bonding of the first BEOL structure BS1 to the second semiconductor substrate 104 may be performed by using the first wafer 202W described with reference to FIG. 6A as the first semiconductor substrate 102 and using the second wafer 204W described with reference to FIG. 6B as the second semiconductor substrate 104. In this case, in process P508 of FIG. 10, the bonding of the first BEOL structure BS1 to the second semiconductor substrate 104 may include aligning the first wafer 202W with the second wafer 204W such that a first notch 202N of the first wafer 202W in the <110> direction and a second notch 404N of the second wafer 204W in the <100> direction or a <112> direction overlap each other in the vertical direction (Z direction) and a first radial direction RB1 from a center 202C of the first wafer 202W and a second radial direction RB2 from a center 204C of the second wafer 204W are in the same direction.

In embodiments, in process P508 of FIG. 10, the bonding of the first BEOL structure BS1 to the second semiconductor substrate 104 may be performed by using the first wafer 202W described with reference to FIG. 6A as the first semiconductor substrate 102 and using the second wafer 204W described with reference to FIG. 6B as the second semiconductor substrate 104. In this case, in process P508 of FIG. 10, the bonding of the first BEOL structure BS1 to the second semiconductor substrate 104 may include aligning the first semiconductor substrate 102 with the second semiconductor substrate 104 such that the <110> direction extending from and parallel to the frontside surface 102F of the first semiconductor substrate 102 including the first wafer 202W and the <100> direction or the <112> direction extending from and parallel to a main surface 104A of the second semiconductor substrate 104 including the second wafer 204W overlap each other in the vertical direction (Z direction) and extend parallel to each other.

In embodiments, in process P508 of FIG. 10, the bonding of the first BEOL structure BS1 to the second semiconductor substrate 104 may include aligning the first semiconductor substrate 102 with the second semiconductor substrate 104 such that a Young's modulus of an arbitrary crystal orientation extending parallel to the frontside surface 102F of the first semiconductor substrate 102 (e.g., a crystal orientation in the first radial direction RA1 shown in FIG. 3A) is different from a Young's modulus of a crystal orientation that overlaps the arbitrary crystal orientation in the vertical direction (Z direction) and extends parallel to the arbitrary crystal orientation (e.g., a crystal orientation in the second radial direction RA2 shown in FIGS. 3A and 3B) in the second semiconductor substrate 104.

In embodiments, in process P508 of FIG. 10, the bonding of the first BEOL structure BS1 to the second semiconductor substrate 104 may include cleaning the resultant structure of FIG. 11C in which the bonding layer BL is formed and the second semiconductor substrate 104, bonding the resultant structure of FIG. 11C in which the bonding layer BL is formed to the second semiconductor substrate 104 such that the bonding layer BL is in contact with the main surface 104A of the second semiconductor substrate 104, and performing an annealing process.

Figure 11E:
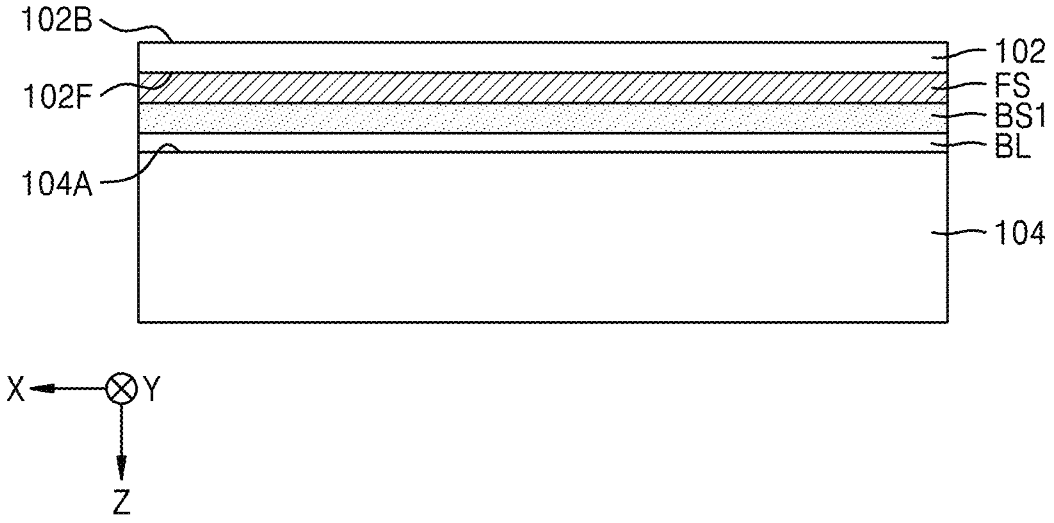

Referring to FIGS. 10 and 11E, in process P510, in the resultant structure of FIG. 11D in which the first BEOL structure BS1 is bonded to the second semiconductor substrate 104, the first semiconductor substrate 102 may be polished from a backside surface 102B of the first semiconductor substrate 102 to reduce a thickness of the first semiconductor substrate 102. As a result, the backside surface 102B of the first semiconductor substrate 102 may become closer to the frontside surface 102F than before.

In embodiments, the first semiconductor substrate 102 may be polished from the backside surface 102B by using at least one selected from a mechanical grinding process, a chemical mechanical polishing (CMP) process, a wet etching process, and a combination thereof.

Figure 11F:
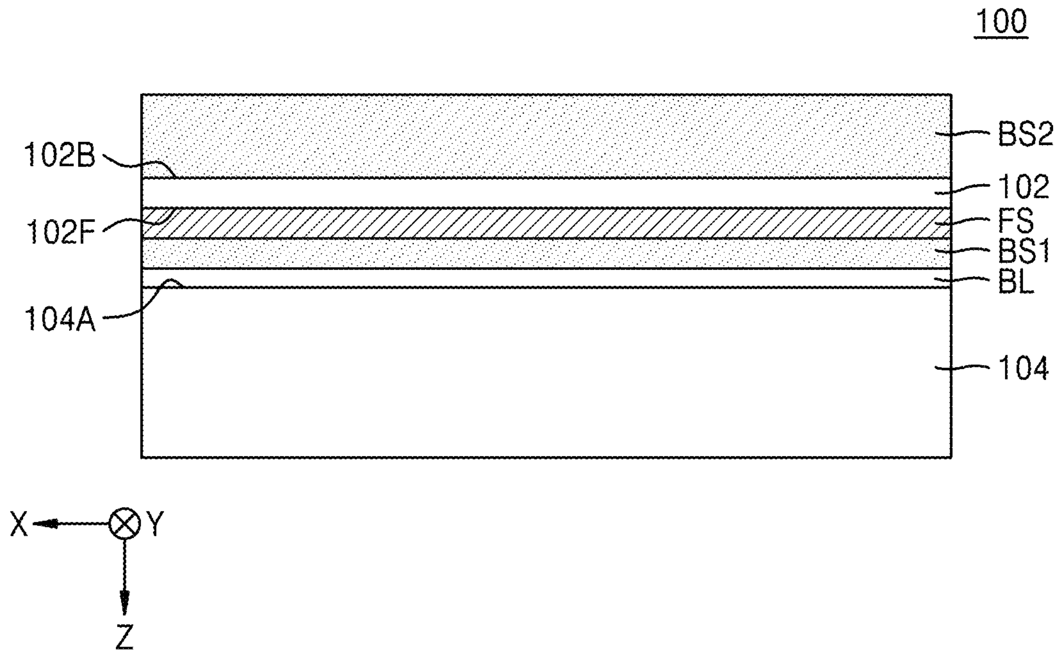

Referring to FIGS. 10 and 11F, in process P512, a second BEOL structure BS2 may be formed on the polished backside surface 102B of the first semiconductor substrate 102 in the resultant structure of FIG. 11E.

In embodiments, the second BEOL structure BS2 may be formed to include a backside wiring structure BWS described with reference to FIGS. 8A to 8D and 9A to 9C.

In embodiments, after the first semiconductor substrate 102 is polished in process P510 of FIG. 10 and before the second BEOL structure BS2 is formed in process P512 of FIG. 10, a process of forming a contact structure including a plug portion passing through the first semiconductor substrate 102 in the vertical direction (Z direction) from the polished backside surface 102B of the first semiconductor substrate 102 may be further performed. For example, the formation of the contact structure may further include forming a contact structure including the via power rail VPR and the power rail wiring MPR described with reference to FIGS. 8A to 8D, forming a contact structure including the backside source/drain contact DBC and the power rail wiring MPR4 descried with reference to FIGS. 9A to 9C, or forming variously modified and changed contact structures thereof.

In the method of manufacturing the IC device according to the inventive concept, even when the first semiconductor substrate 102 gradually becomes thinner and sizes of patterns to be formed on the first semiconductor substrate 102 become smaller, process failures caused by bending distortion of the first semiconductor substrate 102 and overlay errors in the patterns formed at different vertical levels on the first semiconductor substrate 102 may be minimized during the manufacturing processes of the IC devices 100, 100A, and 100B. Accordingly, in the method of manufacturing an IC device, according to the inventive concept, by improving CD uniformity of patterns required to manufacture the IC device, a reliable IC device may be provided, and IC device manufacturing productivity may improve.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a first semiconductor substrate having a frontside surface and a backside surface, which are opposite to each other;
a front-end-of-line (FEOL) structure on the frontside surface of the first semiconductor substrate, the FEOL structure comprising a plurality of fin-type active regions;
a first back-end-of-line (BEOL) on the FEOL structure, the first BEOL structure being spaced apart from the first semiconductor substrate in a vertical direction with the FEOL structure therebetween;
a second BEOL structure on the backside surface of the first semiconductor substrate, the second BEOL structure being spaced apart from the FEOL structure in the vertical direction with the first semiconductor substrate therebetween; and
a second semiconductor substrate spaced apart from the first semiconductor substrate in the vertical direction with the FEOL structure and the first BEOL structure therebetween,
wherein a Young's modulus of a first crystal orientation extending parallel to the frontside surface of the first semiconductor substrate is different from a Young's modulus of a second crystal orientation that overlaps the first crystal orientation in the vertical direction and extends parallel to the first crystal orientation in the second semiconductor substrate.

2. The integrated circuit device of claim 1,
wherein each of the frontside surface of the first semiconductor substrate and a main surface of the second semiconductor substrate, which faces the first semiconductor substrate, has a (100) crystal plane, and
wherein a <110> direction extending from and parallel to the frontside surface of the first semiconductor substrate and a <100> direction extending from and parallel to the main surface of the second semiconductor substrate overlap each other in the vertical direction and extend parallel to each other.

3. The integrated circuit device of claim 1,
wherein the frontside surface of the first semiconductor substrate has a (100) crystal plane, and
wherein a main surface of the second semiconductor substrate, which faces the first semiconductor substrate, has a (111) crystal plane.

4. The integrated circuit device of claim 3, wherein a <110> direction extending from and parallel to the frontside surface of the first semiconductor substrate and a <100> direction or a <112> direction extending from and parallel to the main surface of the second semiconductor substrate overlap each other in the vertical direction and extend parallel to each other.

5. The integrated circuit device of claim 1, further comprising an adhesive layer between the first BEOL structure and the second semiconductor substrate.

6. The integrated circuit device of claim 1, wherein the FEOL structure comprises a logic cell.

7. The integrated circuit device of claim 1, further comprising:
a power rail wiring passing through the first semiconductor substrate in the vertical direction,
wherein the second BEOL structure comprises a wiring layer on the backside surface of the first semiconductor substrate, the wiring layer being connected to the power rail wiring.

8. The integrated circuit device of claim 1, further comprising:
a contact structure passing through the first semiconductor substrate in the vertical direction,
wherein the FEOL structure further comprises:
a source/drain region on a first fin-type active region selected from the plurality of fin-type active regions, the source/drain region being spaced apart from the first semiconductor substrate in the vertical direction with the first fin-type active region therebetween; and
a source/drain contact spaced apart from the first semiconductor substrate in the vertical direction with the first fin-type active region and the source/drain region therebetween, the source/drain contact being connected to the source/drain region, and
wherein the contact structure is connected to a selected one of the source/drain region and the source/drain contact.

9. The integrated circuit device of claim 1, further comprising:
a power rail wiring passing through the first semiconductor substrate in the vertical direction; and
a backside source/drain contact passing through a selected one of the plurality of fin-type active regions in the vertical direction, the backside source/drain contact being connected to the power rail wiring,
wherein the FEOL structure further comprises a source/drain region on the selected one of the plurality of fin-type active regions, the source/drain region being spaced apart from the first semiconductor substrate in the vertical direction with the selected one of the plurality of fin-type active regions therebetween, and
wherein the backside source/drain contact is connected to the source/drain region.

10. The integrated circuit device of claim 1, further comprising:
a power rail wiring passing through the first semiconductor substrate in the vertical direction,
wherein the FEOL structure comprises:
an insulating structure comprising a device isolation film covering a sidewall of each of the plurality of fin-type active regions;
a plurality of gate lines on the plurality of fin-type active regions;
a plurality of source/drain regions on the plurality of fin-type active regions; and
a source/drain contact connected to at least one source/drain region selected from the plurality of source/drain regions, and
wherein the power rail wiring is connected to the source/drain contact.

11. The integrated circuit device of claim 1, wherein the FEOL structure further comprises:
an insulating structure comprising a device isolation film covering a sidewall of each of the plurality of fin-type active regions;
a plurality of source/drain regions on the plurality of fin-type active regions;
a source/drain contact connected to a pair of source/drain regions, which are selected from the plurality of source/drain regions and adjacent to each other, the source/drain contact being spaced apart from the frontside surface of the first semiconductor substrate in the vertical direction with the pair of source/drain regions therebetween; and a contact structure extending lengthwise in the vertical direction to pass between a pair of fin-type active regions, which are selected from the plurality of fin-type active regions and adjacent to each other, and pass between the pair of source/drain regions, the contact structure being in contact with the source/drain contact.

12. The integrated circuit device of claim 1, wherein the FEOL structure comprises:

a gate line on a first fin-type active region selected from the plurality of fin-type active regions;

at least one nanosheet between the first fin-type active region and the gate line, the at least one nanosheet being surrounded by the gate line;

a source/drain region on the first fin-type active region, the source/drain region being in contact with the at least one nanosheet;

a source/drain contact between the source/drain region and the first BEOL structure, the source/drain contact being connected to the source/drain region;

an insulating structure comprising a device isolation film covering both sidewalls of the first fin-type active region; and a contact structure passing through the first semiconductor substrate and the insulating structure in the vertical direction and being connected to a selected one of the source/drain region and the source/drain contact.

13. An integrated circuit device comprising:

a first semiconductor substrate having a frontside surface and a backside surface, which are opposite to each other;

a front-end-of-line (FEOL) structure on the frontside surface of the first semiconductor substrate, the FEOL structure constituting a logic cell;

a first back-end-of-line (BEOL) structure on the FEOL structure, the first BEOL structure being spaced apart from the first semiconductor substrate in a vertical direction with the FEOL structure therebetween;

a second BEOL structure on the backside surface of the first semiconductor substrate, the second BEOL structure being spaced apart from the FEOL structure in the vertical direction with the first semiconductor substrate therebetween; and a second semiconductor substrate spaced apart from the first semiconductor substrate in the vertical direction with the FEOL structure and the first BEOL structure therebetween, wherein the FEOL structure comprises:

a fin-type active region integrally connected to the first semiconductor substrate;

a source/drain region on the fin-type active region, the source/drain region being spaced apart from the first semiconductor substrate in the vertical direction with the fin-type active region therebetween;

a source/drain contact spaced apart from the first semiconductor substrate in the vertical direction with the fin-type active region and the source/drain region therebetween, the source/drain contact being connected to the source/drain region;

a power rail wiring passing through the first semiconductor substrate in the vertical direction; and a contact structure having one end connected to a selected one of the source/drain region and the source/drain contact and another end connected to the power rail wiring, wherein the second BEOL structure comprises a wiring layer on the backside surface of the first semiconductor substrate, the wiring layer being connected to the power rail wiring, and wherein a Young's modulus of a first crystal orientation extending parallel to the frontside surface of the first semiconductor substrate is different from a Young's modulus of a second crystal orientation that overlaps the first crystal orientation in the vertical direction and extends parallel to the first crystal orientation in the second semiconductor substrate.

14. The integrated circuit device of claim 13, wherein each of the frontside surface of the first semiconductor substrate and a main surface of the second semiconductor substrate, which faces the first semiconductor substrate, has a (100) crystal plane, and wherein a <110> direction extending from and parallel to the frontside surface of the first semiconductor substrate and a <100> direction extending from and parallel to the main surface of the second semiconductor substrate overlap each other in the vertical direction and extend parallel to each other.

15. The integrated circuit device of claim 13, wherein the frontside surface of the first semiconductor substrate has a (100) crystal plane, and wherein a main surface of the second semiconductor substrate, which faces the first semiconductor substrate, has a (111) crystal plane.

16. The integrated circuit device of claim 13, wherein a <110> direction extending from and parallel to the frontside surface of the first semiconductor substrate and a <100> direction or a <112> direction extending from and parallel to a main surface of the second semiconductor substrate overlap each other in the vertical direction and extend parallel to each other.

17. The integrated circuit device of claim 13, further comprising an adhesive layer between the first BEOL structure and the second semiconductor substrate.

18. An integrated circuit device comprising:

a first semiconductor substrate having a frontside surface and a backside surface, which are opposite to each other, a front-end-of-line (FEOL) structure comprising a fin-type active region integrally connected to the first semiconductor substrate, a gate line over the fin-type active region, and at least one nanosheet surrounded by the gate line between the fin-type active region and the gate line;

a first back-end-of-line (BEOL) structure on the FEOL structure, the first BEOL structure being spaced apart from the first semiconductor substrate in a vertical direction with the FEOL structure therebetween and comprising a frontside wiring structure;

a second BEOL structure on the backside surface of the first semiconductor substrate, the second BEOL structure being spaced apart from the FEOL structure in the vertical direction with the first semiconductor substrate therebetween, and the second BEOL structure comprising a backside wiring structure; and a second semiconductor substrate spaced apart from the first semiconductor substrate in the vertical direction with the FEOL structure and the first BEOL structure therebetween, wherein the frontside surface of the first semiconductor substrate has a (100) crystal plane, wherein a main surface of the second semiconductor substrate, which faces the first semiconductor substrate, has a (100) crystal plane or a (111) crystal plane, and wherein a Young's modulus of a first crystal orientation extending parallel to the frontside surface of the first semiconductor substrate is different from a Young's modulus of a second crystal orientation that overlaps the first crystal orientation in the vertical direction and extends parallel to the first crystal orientation in the second semiconductor substrate.

19. The integrated circuit device of claim 18, wherein the main surface of the second semiconductor substrate, which faces the first semiconductor substrate, has a (100) crystal plane, and wherein a <110> direction extending from and parallel to the frontside surface of the first semiconductor substrate and a <100> direction extending from and parallel to the main surface of the second semiconductor substrate overlap each other in the vertical direction and extend parallel to each other.

20. The integrated circuit device of claim 18, wherein the main surface of the second semiconductor substrate, which faces the first semiconductor substrate, has a (111) crystal plane, and wherein a <110> direction extending from and parallel to the frontside surface of the first semiconductor substrate and a <100> direction or a <112> direction extending from and parallel to the main surface of the second semiconductor substrate overlap each other in the vertical direction and extend parallel to each other.

* * * * *